United States Patent [19]

Bartko et al.

[11] 4,056,408
[45] Nov. 1, 1977

[54] REDUCING THE SWITCHING TIME OF SEMICONDUCTOR DEVICES BY NUCLEAR IRRADIATION

[75] Inventors: John Bartko, Monroeville; Kuan H. Sun, Pittsburgh, both of Pa.

[73] Assignee: Westinghouse Electric Corporation, Pittsburgh, Pa.

[21] Appl. No.: 667,791

[22] Filed: Mar. 17, 1976

[51] Int. Cl.² .......................................... H01L 21/26
[52] U.S. Cl. ...................................... 148/1.5; 357/91
[58] Field of Search ............................ 148/1.5; 357/91

[56] References Cited

U.S. PATENT DOCUMENTS

| | | | |
|---|---|---|---|
| 3,515,956 | 6/1970 | Martin et al. | 148/1.5 X |
| 3,736,192 | 5/1973 | Tokuyama et al. | 148/1.5 |
| 3,809,582 | 5/1974 | Tarneja et al. | 148/1.5 |
| 3,880,675 | 4/1975 | Tarui et al. | 148/1.5 |
| 3,881,963 | 5/1975 | Chu et al. | 148/1.5 |

Primary Examiner—L. Dewayne Rutledge
Assistant Examiner—J. M. Davis
Attorney, Agent, or Firm—C. L. Menzemer

[57] ABSTRACT

A method of reducing the switching time of certain semiconductor devices and particularly gain-operated semiconductor devices. The depth of maximum defect generation in a given type of semiconductor devices having a block PN junction is determined on irradiation with a given radiation source emitting particles with molecular weight of at least one (1), preferably protons or alpha particles; and the energy level of the radiation source adjusted to provide the depth of maximum defect generation adjacent a blocking PN junction of the type of semiconductor device. At least one semiconductor device of said given type of semiconductor device is positioned with a major surface thereof to be exposed to the adjusted radiation source, and thereafter irradiated with the adjusted radiation source to a given dosage level to reduce the switching time of the semiconductor device. Preferably, the semiconductor device is positioned and the energy level of the radiation source adjusted to irradiate through the major surface of the device closer the higher impurity region adjoining the blocking PN junction, and to provide the maximum defect generation in said higher impurity region adjoining the blocking PN junction but spaced from the PN junction beyond a depletion region formed at the PN junction on application of a specified blocking voltage across the PN junction of the semiconductor device.

28 Claims, 23 Drawing Figures

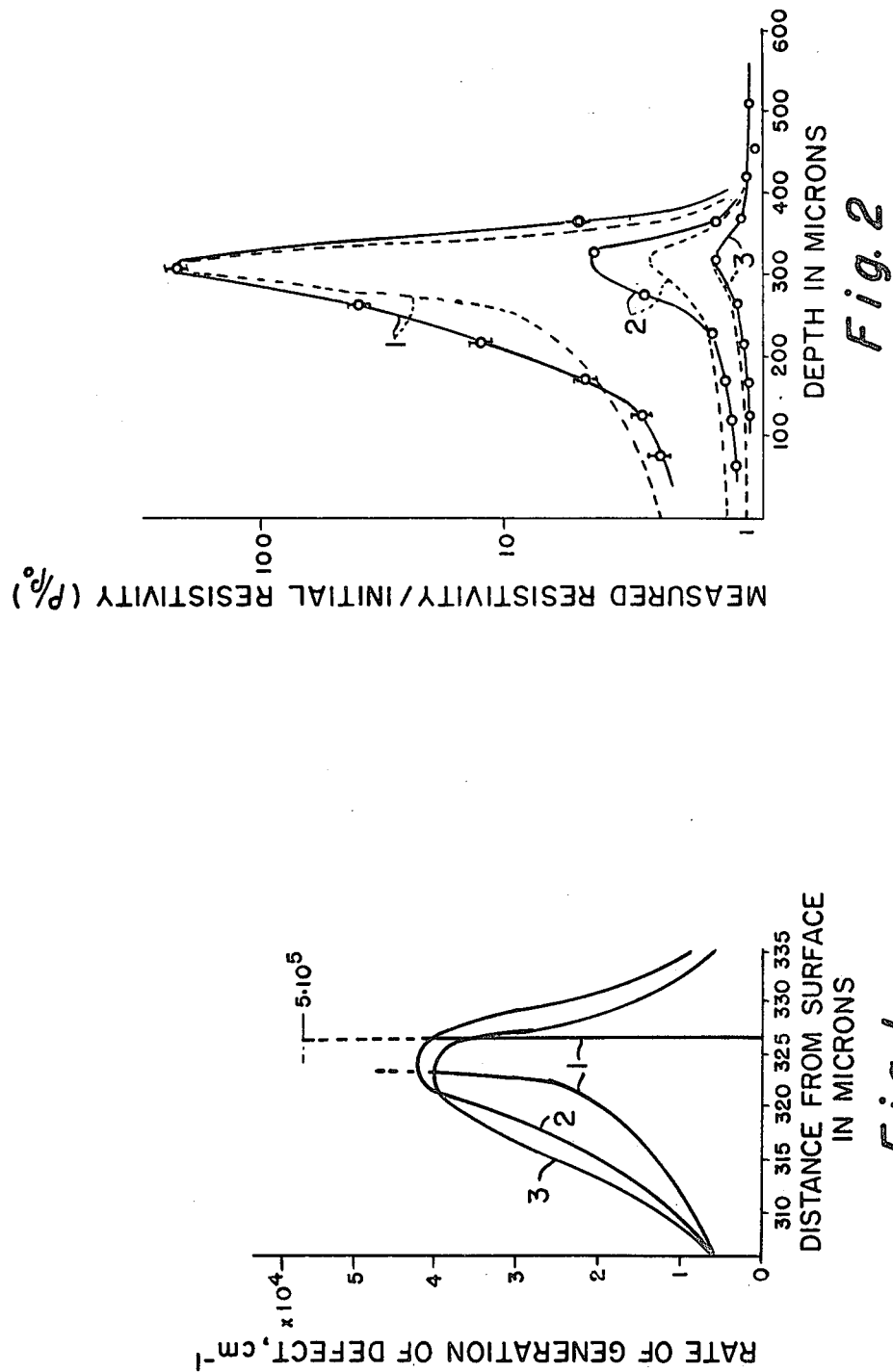

REDUCING THE SWITCHING TIME OF SEMICONDUCTOR DEVICES BY NUCLEAR IRRADIATION

FIELD OF THE INVENTION

The present invention relates to the manufacture of semiconductor devices and particularly high power semiconductor devices utilizing blocking PN junctions.

BACKGROUND OF THE INVENTION

Certain semiconductor devices have one or more blocking PN junctions in their structures. Such semiconductor devices include thyristors, transistors, diodes, diacs, triacs, reverse switching rectifiers and reverse conducting thyristors.

It has recently been demonstrated to irradiate semiconductor devices to modify the electrical characteristics in various ways. See, e.g., U.S. Pat. Nos. 3,809,582, 3,840,887, 3,852,612, 3,872,493, 3,877,997, 3,881,963, 3,881,964, 3,888,701 and 3,933,527, and U.S. Patent applications Ser. Nos. 540,208 (filed Jan. 10, 1975), 581,255 (filed May 27, 1975), and 357,435 (filed May 4, 1973), all of which are assigned to the same assignee as the present invention.

More particularly, U.S. Pat. Nos. 3,881,963 and 3,809,582 teach to irradiate high power thyristors and diodes with radiation sources generally and electron radiation sources preferably to decrease the turn-off time and reverse recovery time of such devices. Such irradiation has been demonstrated to produce distinct advantages over gold diffusion previously employed to produce fast switching devices. However, these radiation techniques have been found to have their limitations where other electrical characteristics and particularly forward voltage drop are to be maintained. If a very low turn-off time or reverse recovery time is desired, a higher forward voltage drop has to be tolerated in the device. Therefore, simply irradiating the thyristor or diode to reduce the turn-off time or reverse recovery time has involved a trade-off to a greater or lesser degree with forward voltage drop.

The limitation of this trade-off has been reduced to some degree by annealing processes described in U.S. Pat. No. 3,888,701, granted June 10, 1975. However, annealing has involved added processing steps and added time and expense in the fabrication of the semiconductor devices. And still some trade-off of turn-off time and reverse recovery time with forward voltage drop was necessary.

The present invention eliminates the need for annealing to relieve the trade-off involved in previous simple irradiation processes. It provides, by simple irradiation, high power semiconductor devices having blocking PN junctions with low switching times heretofore unattainable by simple irradiation processes while maintaining the forward voltage drop.

The nature of defect generation in silicon by proton irradiation has been investigated experimentally, Y. V. Bugakov and T. I. Kolomenskaya, Soviet Physics-Semiconductors 1, 346 (1967) and the nature of defect generation by proton, deuteron and alpha irradiation been predicted theoretically, Y. V. Bugakov and M. A. Kumakhov, Soviet Physics-Semiconductors 2, 1334 (1968). These analyses demonstrated that the defect generation by such nuclear irradiation is concentrated in relatively narrow regions near the end of the particle penetration into the silicon. FIG. 1 shows the predicted defect generation distribution in silicon for protons of 6.3 MeV energy, where curve 1 illustrates the rate of generation of defects by a single particle, curve 2 illustrates the rate of generation of defects for a beam of monoenergetic protons taking into account straggling, and curve 3 illustrates the rate of generation of defects for a beam of monoenergetic protons taking into account straggling and multiple scattering. FIG. 2 shows the experimentally measured depth dependance of resistivity ($\rho$) in previously 30 ohm-cm resistivity silicon after irradiation with protons of 6.3± 0.2 MeV energy, where curve 1 is to a radiation dosage of $6.8 \times 10^{12}$ p/cm$^2$, curve 2 is to a radiation dosage of $1.2 \times 10^{12}$ and curve 3 is to a radiation dosage of $5.2 \times 10^{11}$ p/cm$^2$, and the corresponding dotted curves represent theoretically produced resistivity dependance. The analysis shows that the spatial distribution of defect generation (gaussian shaped) peaks near the end of the proton range with a narrow width at half maximum, i.e., "half-width". The analyses predicted similar spatial distribution of defect generation for alpha particles with a narrower half-width.

The analyses did not, however, disclose or suggest that such nuclear radiation defect generation could be utilized to unique advantage to improve the switching time of certain semiconductor devices.

SUMMARY OF THE INVENTION

The present invention provides a method of reducing the switching time of certain semiconductor devices such as thyristors, triacs, diacs, reverse switching rectifier and reverse conducting thyristors. The present invention reduces the switching time without significantly increasing the forward voltage drop and also without significantly increasing the leakage current.

The method is commenced by determining the depth of maximum defect generation in a given type of semiconductor device having a blocking PN junction on irradiation with a given, preferably monoenergetic radiation source radiating particles with molecular weight of at least one. Preferably, such nuclear radiation source is a proton or alpha particle radiation source because such radiation sources can be produced relatively inexpensively and are essentially chemically and electrically inactive on irradiation into the semiconductor device. As explained in more detail hereinafter, there are however certain embodiments where higher molecular weight particles, such as nitrogen ions, may be more desirable because of the need for defect generation distributions with narrower half-width, i.e., the width of the distribution curve at one-half the maximum defect generation. See FIG. 1 for a better understanding of "half-width".

The energy level of the radiation source is adjusted to provide the depth of maximum defect generation adjacent the PN junction of the device and preferably in the impurity region of higher impurity concentration adjoining the blocking PN junction in the given type of semiconductor device. The positioning of the maximum defect generation can be readily located by measuring the structural profile of the device because the range of such nuclear particles in semiconductor materials is easily determinable and the maximum defect generation occurs near the end of the range of penetration of the radiation into the device.

At least one and typically a plurality of semiconductor devices are then positioned with a major surface thereof to be exposed to the selected, adjusted radiation source. That major surface is preferably closer and possibly adjoining the higher impurity concentration region adjoining the block PN junction. In this way, irradiation of the lower impurity concentration region adjoining the blocking PN junction, which supports the blocking voltage, can be minimized or eliminated, and the leakage current of the device is not significantly increased by the irradiation. For the same reason, it is additionally preferred that the maximum defect generation be positioned in the higher impurity concentration region adjoining the blocking PN junction spaced beyond a depletion region found at the PN junction on application of a specified blocking voltage across the semiconductor device.

The semiconductor devices are thereafter irradiated with the adjusted radiation source to which they are exposed to a dosage level reducing the switching time of the semiconductor device without significantly affecting other desired electrical characteristics. The method is particularly useful in reducing the switching time of thyristors and devices including thyristors such as triacs, diacs, reverse switching rectifiers and reverse conducting thyristors. Again, in these embodiments, protons and alpha particles are preferably used and the dosage level of irradiation is preferably between about $1 \times 10^{10}$ and about $5 \times 10^{11}$ protons per centimeter square or between about $1 \times 10^9$ and about $5 \times 10^{10}$ alpha particles per centimeter square.

Other details, objects and advantages of the invention become apparent as the following description of the presently preferred embodiments and presently preferred methods of practicing the same proceeds.

BRIEF DESCRIPTION OF THE DRAWINGS

In the accompanying drawings, the preferred embodiments of the invention and presently preferred methods of practicing the invention are illustrated in which:

FIG. 1 is a graph illustrating the known theoretically predicted spatial distribution of proton radiation defects (or the rate of generation of defects) in silicon;

FIG. 2 is a graph illustrating the experimentally observed and theoretically predicted dependance of resistivity on the depth in proton irradiation silicon;

DESCRIPTION OF THE EMBODIMENTS

Figure 3:
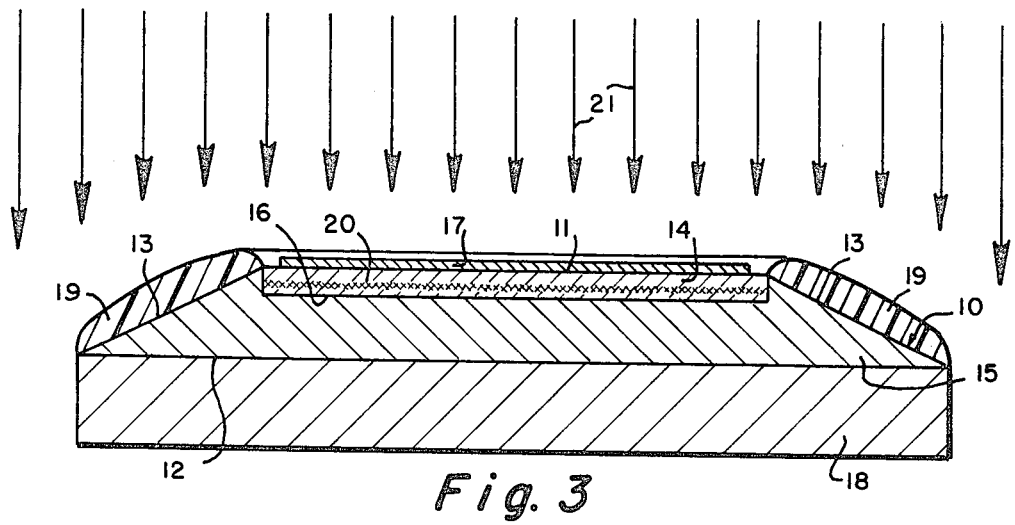
FIG. 3 is an elevational view in cross-section of a diode being irradiated in accordance with the present invention.

Referring to FIG. 3, a diode being irradiated in accordance with the present invention is disposed in silicon wafer or body 10 having opposed major surfaces 11 and 12 and curvilinear side surfaces 13. The diode is comprised of cathode region 14 and anode region 15 having impurities of opposite conductivity and adjoining major surfaces 11 and 12 respectively. Preferably cathode region 14 has a surface doping concentration between $1 \times 10^{19}$ and $1 \times 10^{20}$ atoms/cm$^3$ and is formed by diffusion of a suitable impurity such as phosphorus or boron into body 10 through major surface 11 by standard techniques; and anode region 15 is preferably formed by the residue impurity, typically of between $1 \times 10^{13}$ and $1 \times 10^{14}$ atoms/cm$^3$, grown into body 10 during its fabrication. Formed at the transition between cathode and anode regions 14 and 15 in the interior of body 10 is blocking PN junction 16.

To provide electrical contact to the diode, metal electrodes 17 and 18 make ohmic contact to cathode region 14 and anode region 15 at major surfaces 11 and 12, respectively. Electrode 17 is typically formed to about 40,000 Angstroms in thickness by selective metallization of a suitable metal such as aluminum, or alternatively, by indiscriminate metallization of such a metal followed by selective removal of the metal by standard photolithographic and etch techniques. Electrode 18 is typically a supporting electrode of a metal such as molybdenum of about 80 mils in thickness alloyed to major surface 12. To reduce channeling effects and atmospheric effects on the diode operation, side surfaces 13 are beveled by lap etching and coated with a suitable passivating resin 19 such as silicone, epoxy or varnish composition.

Irradiation is performed on the diode by positioning major surface 11 of body 10 for exposure to the suitable nuclear radiation source as hereinafter described. It should be noted that the structure of the diode is inverted from typical diode structures heretofore made. That is, cathode region 14, which the higher impurity concentration region, is positioned opposite from electrode 18 so that it can be readily exposed to nuclear radiation in accordance with the present invention. Stated another way, diode body 10 is positioned to irradiate through major surface 11 adjoining and closer the higher impurity concentration region 14 adjoining the blocking PN junction 16. By this arrangement, irradiation of the lower impurity concentration region 15, which primarily supports the blocking voltage, is minimized or eliminated so that greater reduction in switching time is achieved while minimizing increases in forward voltage drop and leakage current across the device.

For irradiation, a suitable radiation source is selected which emits nuclear particles of a molecular weight of at least one. Preferably, the radiation source emits protons, alpha particles or nitrogen ions because such particles are essentially electrically and chemically inactive on irradiation into the semiconductor body. In this regard, a second level or preference is expressed for beryllium ions. Other nuclear particles having a molecular weight of at least 1 may be utilized; however, nuclear particles having a molecular weight higher than 16 are presently impractical because available radiation sources, e.g., Van de Graaff accelerators, do not generate high enough energy to cause penetration of such higher molecular weight particles into the semiconductor body to the desired depth as hereinafter described. Additionally, nuclear particles such as boron ions, carbon ions and oxygen ions should not be utilized because of their electrical and chemical activity on penetration into the semiconductor body. For these reasons, proton and alpha radiation are generally most desired, although higher molecular weight particles such as nitrogen ions may be more useful in certain applications where a narrower half-width is desired for the defect generation distribution.

Additionally, the radiation source is preferably an essentially monoenergetic source, such as a Van de Graaff accelerator, to obtain the narrowest half-width for the defect generation distribution. With certain radiation sources, it may be appropriate to sacrifice monoenergetics to some degree to utilize a scattering foil to provide a more uniform particle distribution over the surface of the device, where the radiation beam cannot be modulated horizontally and vertically to achieve uniform particle distribution. Generally, the monoenergetics of the radiation source is, however, achieved to the extent possible to provide the narrowest half-width for the defect generation distribution and in turn lowest switching times while maintaining the forward voltage drop.

On selection of the radiation source, the energy level is adjusted to provide the depth of maximum defect generation (i.e., the peak of the resulting defect generation distribution) adjacent the blocking PN junction 16 of the diode. The particular energy level will vary with each type of semiconductor device and particularly with the semiconductor material of body 10, the material and thickness of metal electrode 17, and the width of cathode region 14. The particular energy level is adjusted experimentally by first generally selecting the appropriate energy range from a graph such as that shown in FIG. 10, and then irradiating various diodes of the particular type of diode to be irradiated with different energies within the selected energy range and measuring the desired electrical characteristics, e.g., switching time, forward voltage drop and leakage current. The optimum energy level can then be selected by plotting the measured electrical characteristics on a graph as illustrated in FIG. 11, or by processing the data by digital computer.

Diodes of the particular type of diode shown in FIG. 3 are thereafter irradiated by irradiation 21 from the selected, adjusted radiation source to a dosage level sufficient to reduce the switching time, i.e, the reverse recovery time ($t_{rr}$), of the device to a desired value. Again, the optimum dosage level is selected experimentally along with the optimum energy level by irradiation of groups of diodes of the particular type of diode to different dosage levels and graphically plotting the forward voltage drop, and also preferably the leakage current, as a function of the reverse recovery time as shown in FIG. 11. Again, processing by digital computer may alternatively be used to select the dosage level. Preferably, the maximum defect generation is provided generally at the dotted line 20 in FIG. 3, which is in cathode region 14 spaced from blocking PN junction 16 to avoid the boundary of a depletion region formed at PN junction 16 on application of a specified blocking voltage across the diode. As explained in further detail hereinafter, so positioning the maximum defect generation provides for greater reduction of the switching time, i,e., reverse recovery time ($t_{rr}$), with a minimum of increase of forward voltage drop and leakage current.

Figure 4:
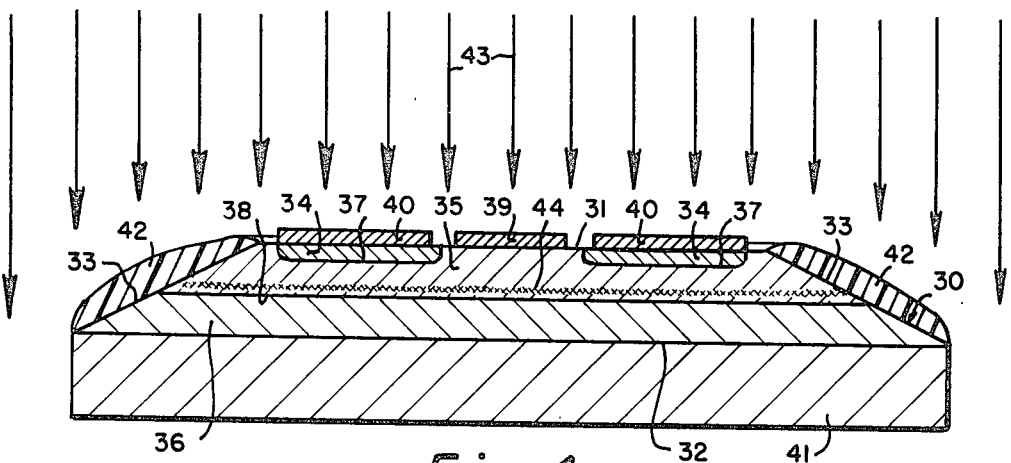
FIG. 4 is an elevational view in cross-section of a transistor being irradiated in accordance with the present invention.

Referring to FIG. 4, a center-driven transistor wafer or body 30 being irradiated in accordance with the present invention is shown having opposed major surfaces 31 and 32 and curvilinear side surfaces 33. Transistor body 30 has emitter and collector regions 34 and 36 of impurities of one conductive type adjoining major surfaces 31 and 32 respectively, and base region 35 of impurity of the opposite conductivity type in the interior of the wafer 30 between emitter and collector regions 34 and 36. Preferably, base and emitter regions 35 and 34 are formed by sequential diffusion of impurities of opposite conductivity such as phosphorus and boron by standard diffusion techniques. Regions 35 and 34 typically having surface impurity concentrations between $1 \times 10^{17}$ and $1 \times 10^{18}$ atoms/cm$^3$ and between $1 \times 10^{20}$ and $5 \times 10^{20}$ atoms/cm$^3$ respectively. Collector region 36 is preferably formed by the residue impurity, typically of about $1 \times 10^{15}$ to $1 \times 10^{16}$ atoms/cm$^3$, grown into body 30 during its fabrication. By this arrangement, transistor body 30 is provided with a three-layer impurity structure in which two PN junctions 37 and 38 are provided, of which PN junction 38 is a blocking junction. The transistor is center-driven by adjoining base region 35 to major surface 31 at center portions of body 30 centrally of emitter region 34. Emitter region 34 thereby extends around surface portions of base region 35 to define the gate of the transistor at center portions of body 30.

To provide electrical connection to the transistor body, metal electrodes 39 and 40 make ohmic contact to base region 35 and emitter region 34, respectively, at major surface 31. Preferably, electrodes 39 and 40 are deposited to a thickness typically of about 40,000 Angstroms by selective metallization of a suitable metal such as aluminum, or alternatively, by indiscriminate metallization of such a metal followed by selective removal of the metal by standard photolithographic and etch techniques. Electrical contact is made to collector region 36 by alloying supporting electrode 41 of a suitable metal such as molybdenum, typically of about 80 mils in thickness, to major surface 32. Atmospheric effects on the transistor operation are reduced by coating major surfaces 33 with a suitable passivating resin 42 such as a silicone, epoxy or varnish composition.

Irradiation is performed on the transistor body by positioning major surface 31 of body 30 for exposure to a suitable nuclear radiation source, such as a Van de Graaff accelerator. By this arrangement, it should be noted that transistor body 30 is positioned to be irradiated through major surface 31 adjoining and closer higher impurity concentration region, i.e., the base region 35, adjoining blocking PN junction 38. Radiation of collector region 36 of lower impurity concentration (Higher resistivity) is thus minimized or eliminated, and greater reduction of the switching time of the transistor can be achieved while minimizing the increase in forward voltage drop and leakage current across the device.

For radiation, a suitable radiation source is selected which radiated nuclear particles of a molecular weight of at least one. In selection of said nuclear radiation source, the same prescription is followed as above described with reference to FIG. 3. Again, proton and alpha particle radiation sources are generally most desirable because such radiation is relatively inexpensive and conventionally available, and are essentially electrically and chemically inactive on penetration into the semiconductor body. It should be noted, however, that higher molecular weight particles such as nitrogen ions may be more useful in certain applications where a narrower half-width is desired for the defect generation distribution in transistor body 30.

On selection of the radiation source, the radiation level is again adjusted to provide the depth of maximum defect generation adjacent blocking PN junction 38 of the transistor. The energy level is adjusted by experimentally selecting the appropriate energy range from a graph such as that shown in FIG. 10, and thereafter irradiating various transistors of the particular type of transistor to be irradiated with different energy levels within the selected energy range and measuring the electrical characteristics and particularly the switching time, forward voltage drop and leakage current thereof. The optimum energy level can thus be selected by plotting the measured electrical characteristics on a graph such as the one illustrated in FIG. 13, or by processing the measured data by digital computer.

Figure 13:
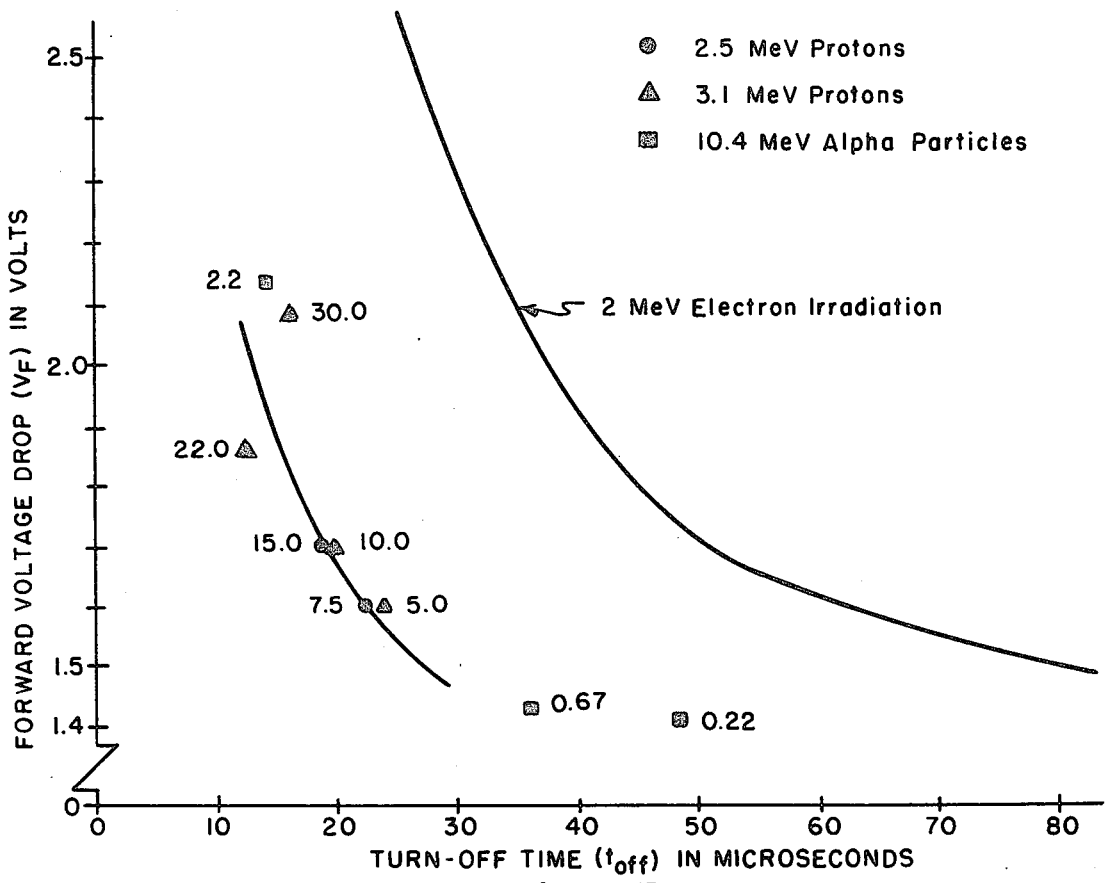
FIG. 13 is a graph showing the relationship between turn-off time and forward voltage drop on irradiation of thyristors of a given type (T62N BB) with proton, alpha and electron radiation to different dosages.

Transistors of the given type of transistor, such as that shown in FIG. 4, are thereafter irradiated by radiation 43 from the selected, adjusted radiation source to a dosage level sufficient to reduce the switching time of the device to a desirable value. Again, the optimum dosage level is selected experimentally along with the optimum energy level by irradiating groups of transistors of the particular type of transistor to various dosage levels, and graphically plotting the forward voltage drop as a function of the switching time, as shown in FIG. 13, and preferably also the leakage current as a function of the switching time. Again, processing of the measured data by digital computer may be, alternatively, made to select the dosage level. Preferably, the maximum defect generation is provided generally at dotted line 44 in FIG. 4, which is in base region 35 spaced from blocking PN junction 38 to avoid the boundary of a depletion region formed at PN junction 38 on application of a specified blocking voltage across the transistor. As explained in detail hereinafter, such positioning of the maximum defect generation provides for greatest reduction of the switching time with a minimum increase of forward voltage drop and leakage current.

Figure 5:
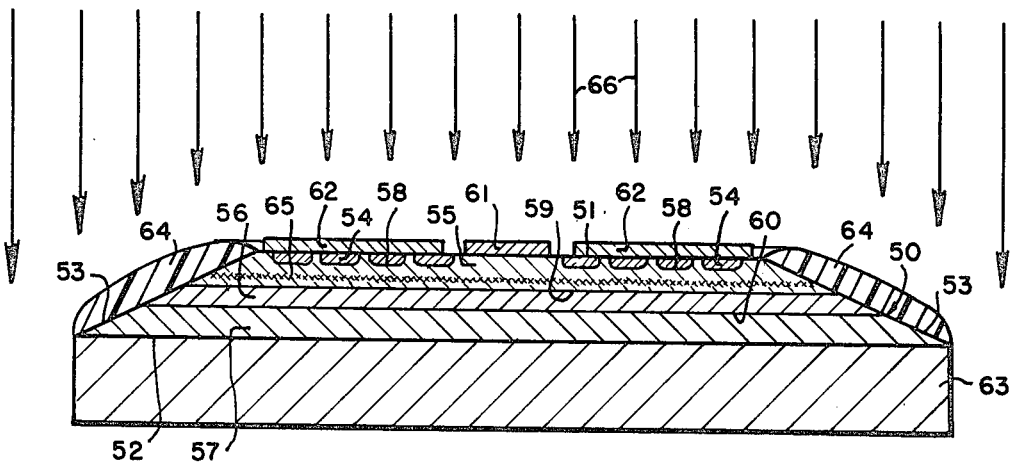
FIG. 5 is an elevational view in cross-section of a center-fired thyristor being irradiated in accordance with the present invention.

Referring to FIG. 5, center-fired thyristor wafer or body 50 being irradiated in accordance with the present invention has opposed major surfaces 51 and 52 and curvilinear side surfaces 53. The thyristor body 50 has cathode-emitter region 54 and anode-emitter region 57 of impurities of opposite conductivity type adjoining major surfaces 51 and 52, respectively, and cathode-base region 55 and anode-base region 56 of impurities of opposite conductivity type in the interior of body 50 between emitter regions 54 and 57. Cathode-emitter region 54 and cathode-base region 55 are also impurities of opposite conductivity type, as are anode-base region 56 and anode-emitter region 57. Preferably, cathode-base and anode-emitter regions 55 and 57 are simultaneously formed by diffusion of for example gallium and/or aluminum through major surfaces 51 and 52 by standard techniques, typically to a surface concentration between $1 \times 10^{17}$ and $1 \times 10^{19}$ atoms/cm$^3$. Cathode-emitter region 54 is thereafter formed by selective diffusion of for example phosphorus through major surface 51 by standard techniques. By this arrangement, thyristor body 50 is provided with a four-layer impurity structure in which three PN junctions 58, 59 and 60 are provided, of which PN junction 59 is a blocking junction.

The thyristor is provided with a center-fired gate by adjoining cathode-base region 55 to major surface 51 at center portions of body 50. Cathode-base region 55 also adjoins major surface 51 intermittently of cathode-emitter region 54 to form shunts conventional in high power thyristors. To provide electrical contact to thyristor body 50, metal electrodes 61 and 62 make ohmic contact to cathode-base region 51 and cathode-emitter region 54, respectively, at major surface 11. Preferably, gate electrode 61 and cathode electrode 62, typically of about 40,000 Angstroms in thickness, are deposited by selective metallization of a suitable metal such as aluminum, or alternatively, indiscriminate metallization of a such metal followed by selective removal of the deposited metal by standard photolithographic and etch techniques. Supporting metal electrode 63 makes ohmic contact to anode-emitter region 57 at major surface 52 preferably by alloying electrode 63 of a suitable metal such as molybdenum, of 80 mils in thickness, to body 50. Atmospheric effects on the thyristor operation are substantially reduced by coating side surfaces 53 with a suitable passivating resin 64 such as a silicone, epoxy or varnish composition.

Radiation is performed on the thyristor by positioning major surface 51 of body 50 for exposure to a suitable nuclear radiation source, such as a Van de Graaff accelerator. By this arrangement, thyristor body 50 is positioned to be irradiated through major surface 51 adjoining and closer higher impurity region, i.e., the cathode-base region 55, adjoining blocking PN junction 59 so that irradiation of anode-base region 56 of lower impurity concentration adjoining PN junction 59 so that irradiation of anode-base region 56 of lower impurity concentration adjoining PN junction 59 can be minimized or eliminated. Greater reduction of the switching time of the thyristor can thus be achieved while minimizing the increase in forward voltage drop and leakage current across the device.

For radiation, a suitable radiation source is selected which radiates nuclear particles of a molecular weight of at least one. In selection of such nuclear radiation source, the same prescription is followed as described with reference to FIG. 3. Again, proton and alpha particle radiation sources are generally most desirable because such radiation sources are relatively inexpensive and conventionally available. In addition, proton and alpha particle radiation remains essentially electrically and chemically inactive on penetration into the semiconductor body. Again, it should be observed, however, that higher molecular weight particles such as nitrogen ions may be more useful in certain applications where a narrower half-width is desired for the defect generation distribution in the thyristor.

On selection of a radiation source, the energy level is again adjusted to provide the depth of maximum defect generation adjacent blocking PN junction 59 of the thyristor. The energy level is adjusted by experimentally selecting an energy range from a graph such as that shown in FIG. 10, and thereafter radiating various thyristor bodies of the particular type of thyristor to be irradiated with different energy levels within the selected energy range and measuring the electrical characteristics and particularly the turn-off time, forward voltage drop and leakage current. The optimum energy level can be selected by plotting the measured electrical characteristics as a function of turn-off time in a graph such as the one illustrated in FIG. 13, or by processing the measured data by digital computer.

Thyristors of the given type of thyristor shown in FIG. 5 are thereafter irradiated by radiation 66 from the selected, adjusted radiation source to a dosage level sufficient to reduce the switching time of the device to a desired level. Again, the optimum dosage level is selected experimentally along with the optimum energy level by irradiating groups of thyristors of a particular type of thyristor, as shown, to various dosage levels, and graphically plotting the forward voltage, and also preferably the leakage current, as a function of the turn-off time as shown in FIG. 13. Alternatively, the measured data may be processed by digital computer to select the desired dosage level. Preferably, where proton or alpha particles sources are used the radiation dosage is between about $1 \times 10^{10}$ and about $5 \times 10^{11}$ protons/cm$^2$ or between about $1 \times 10^9$ and about $5 \times 10^{10}$ alpha particles/cm$^2$.

In any case, the maximum defect generation is preferably provided generally at dotted line 65 in FIG. 5 which is in cathode-base region 55 spaced from blocking PN junction 59. Additionally, it is preferred that the maximum defect generation 65 be spaced from the depletion region formed at blocking PN junction 59 on application of the specified blocking voltage across the thyristor body. As explained in detail hereafter, such positioning of the maximum defect generation provides for greatest reduction of the turn-off time of the thyristor with a minimum increase of forward voltage drop and leakage current.

Figure 6:
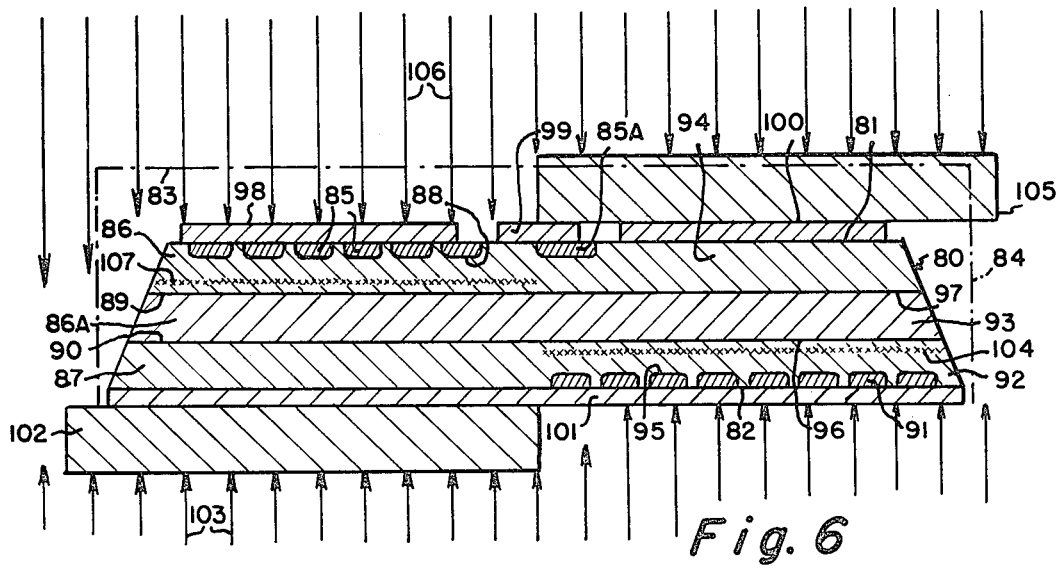
FIG. 6 is an elevational view in cross-section of triac being irradiated in accordance with the present invention.

Referring to FIG. 6, a triac being irradiated in accordance with the present invention is shown disposed in semiconductor body 80 having first and second opposed major surfaces 81 and 82. The triac is comprised of two interconnected components, first and second thyristors 83 and 84, shown in chain-line adjacent each other in semiconductor body 80. Thyristors 83 and 84 are positioned electrically in reverse parallel, with common base regions and a common gate electrode as hereinafter described.

Thyristor 83 has cathode-emitter region 85 typically of N-type impurity adjoining major surface 81. Cathode-emitter region 85 is formed typically by diffusion of phosphorus to a surface impurity concentration of about $1-1.5 \times 10^{20}$ atoms/cm$^3$. Adjoining cathode-emitter region 85 is cathode-base region 86 of P-type impurity of a surface concentration preferably of between about $1 \times 10^{16}$ and $1 \times 10^{20}$ atoms/cm$^3$ formed typically by selective diffusion of aluminum and/or gallium. Cathode-base region 86 forms PN junction 88 with cathode-emitter region 85. Cathode-base region 86 also extends intermittently through cathode-emitter region 85 to adjoin major surface 81 and form conventionally shunts through cathode-emitter region 85. Thyristor 83 also has anode-emitter 87 typically of P-type impurity adjoining major surface 82. Anode-emitter region 87 typically has a surface impurity concentration of about $1 \times 10^{18}$ atoms/cm$^3$ formed typically by diffusion of aluminum and/or gallium along with cathode-base region 86. Anode-base region 86A of N-type impurity cathode-base region 86 and anode-emitter region 87 interior of semiconductor body 80 and forms PN junctions 89 and 90 with cathode-base region 86 and anode-emitter region 87, respectively, with PN junction 89 being a blocking junction.

Thyristor 84 is formed preferably simultaneously with thyristor component 83. Thyristor 84 comprises cathode-emitter region 91 adjoining major surface 82 with a surface impurity concentration typically of about 1 to $1.5 \times 10^{20}$ atoms/cm$^3$. Preferably, cathode-emitter region 91 is formed simultaneously by selective diffusion along with cathode-emitter region 85. Cathode-base region 92 of P-type impurity adjoins cathode-emitter region 91 forming PN junction 95 with cathode-emitter region 91. Cathode-base region 92 also extends intermittently through to adjoin major surface 82 and form shunts through cathode-emitter region 91. Cathode-base region 92 is a common active region with anode-emitter region 87 and is typically simultaneously formed by diffusion along with cathode-base region 86 and anode-emitter region 87.

Thyristor 84 also has anode-emitter region 94 of P-type impurity adjoining major surface 81. Anode-emitter region 94 is common with cathode-base region 86 and is typically simultaneously formed by diffusion along with cathode-base region 86, anode-emitter region 87 and cathode-base region 92. Anode-base region 93 of N-type impurity adjoins cathode-base region 92 and anode-emitter region 94 interior of semiconductor body 80 and forms PN junctions 96 and 97 with cathode-base region 92 and anode-emitter region 94, respectively, which PN junction 96 may be a blocking junction. Anode-base region 93 is common with anode-base region 86A, which are formed by the original doping of semiconductor body 80 during its growth typically to between $1 \times 10^{13}$ and $1 \times 10^{14}$ atoms/cm$^3$.

Remote gating region 85A is also formed in thyristor 84 adjoining major surface 81 centrally of semiconductor body 80. Gating region 85A is preferably formed by selective diffusion along with cathode-emitter regions 85 and 91.

Thyristors 83 and 84 are circuited in reverse parallel by providing gate electrode 99 and main electrode 100 on major surface 81 preferably by metallizing the entire major surface 81 typically to a thickness of about 40,000 Angstroms and thereafter selectively removing portions of the deposited metal by standard photolithographic and etch techniques. Electrode 100 is thereby formed in an annulus annularly of circular electrode 99 positioned at the center of semiconductor body 80. Electrode 100 forms the cathode electrode of thyristor 83 and the anode electrode of thyristor 84. Electrode 99, together with remote gating region 85A, forms the common gate electrode for thyristors 83 and 84. Metal electrode 101 is also formed preferably by metallization over major surface 82 to form the anode electrode of thyristor 83 and the cathode electrode of thyristor 84. It should be noted that the supporting metal electrode which is typically utilized for electrode 101 is not provided before irradiation, so that semiconductor body 80 may be selectively irradiated with nuclear radiation through both major surfaces 81 and 82. After irradiation, a suitable metal electrode typically of molybdenum may be alloyed to electrode 101 to provide support for semiconductor body 80.

It should be noted that while the triac is typically made as described, the N-type and P-type regions may be reversed in certain embodiments to provide a complimentary triac. Also, it should be observed that the triac may be modified to a diac by eliminating gating region 85A and merging metal electrodes 99 and 100 over major surface 81.

The triac is irradiated by positioning major surface 82 of body 80 for exposure to a suitable nuclear radiation source such as a Van de Graaff accelerator. By so positioning body 80, it should be noted that the body is positioned to be irradiated through major surface 82 adjoining and closer to higher impurity region, i.e., the cathode-base region 92, adjoining blocking PN junction 96 of thyristor 84. Maximum defect generation can thus be provided adjacent blocking PN junction 96 in cathode-base region 92 while minimizing or eliminating irradiation of anode-base region 93. The thyristor can thereby be provided with greater reduction of the switching time without significantly increasing forward voltage drop and leakage current.

For this reason, thyristor 83 is preferably selectively masked from irradiation when thyristor 84 is irradiated. The selective irradiation is accomplished by positioning masked or shield plate 102 adjacent metal electrode 101 adjacent thyristor 83. Shield plate 102 is of any suitable material of sufficient density or thickness to be opaque to the selected radiation source. For proton or alpha radiation, shield plate 102 may be aluminum of about 4 mils in thickness, or low-carbon steel, tungsten or lead of like thickness. Shield plate 102 is positioned to minimize the irradiation of thyristor 83 while permitting the largest possible area of thyristor 84 to be irradiated.

A suitable radiation source is selected that radiates nuclear particles of a molecular weight of at least one by following the prescription described above with reference to FIG. 3. Again, proton and alpha particle radiation sources are generally most desirable because such radiation is relatively inexpensive and readily available from conventional radiation sources, and is essentially electrically and chemically inactive on penetration into the semiconductor body. It should be emphasized again, however, that higher molecular weight particles such as nitrogen ions may be more useful in particular applications where a narrower half-width is desired for the defect generation distribution in the triac.

On selection of the radiation source, the radiation level is again adjusted to provide the depth of maximum defect generation adjacent blocking PN junction 96 of thyristor 84 of the triac. The energy level is adjusted by selecting the appropriate energy range from a graph such as that shown in FIG. 10, and thereafter irradiating various triacs of a particular type of triac to be irradiated with different energy levels within the selected energy range and measuring the electrical characteristics and particularly the switching time, forward voltage drop and leakage current. The optimum energy level can thus be selected by plotting the selected measured characteristics on a graph such as the one shown in FIG. 13, or by processing the measured data in a digital computer. In these measurements, only the electrical characteristics of thyristor 84 of the triac are considered; however, the optimum energy level that is selected for irradiation of thyristor 84 should be applicable in subsequently selective irradiation of thyristor 83 because the cathode-base regions and cathode-emitter regions of the two thyristor components are typically formed by diffusion at the same time and are, in any case, generally of the same dimensions to provide complimentary electrical characteristics for the triac. Preferably, where proton or alpha particle radiation sources are used, the radiation dosage is between about $1 \times 10^{10}$ and about $5 \times 10^{11}$ protons/cm$^2$ or between about $1 \times 10^9$ and about $5 \times 10^{10}$ alpha particles/cm$^2$.

Triacs of the given type of triac as shown in FIG. 6 are thereafter irradiated by radiation 103 from the selected, adjusted radiation source to a dosage level sufficient to reduce the switching time of thyristor 84 to a desired value. Again, the optimum dosage level is selected experimentally along with the optimum energy level by irradiating groups of triacs of the particular type of triac to various dosage levels, and graphically plotting the forward voltage drop, and also preferably the leakage current of thyristor 84, as a function of the switching time thereof. The optimum dosage level may also be selected by processing the measured data in a digital computer. Preferably, maximum defect generation is provided generally at dotted line 104 in the FIG. 6, which is in cathode-base region 92 spaced from blocking PN junction 96 beyond a depletion region formed at PN junction 96 on application of a specified blocking voltage across thyristor 84 of the triac. As explained in detail hereinafter, such positioning of the maximum defect generation provides for greater reduction of the switching time with a minimum increase of forward voltage drop and leakage current.

Thereafter, semiconductor body 80 is repositioned to expose major surface 81 to the selected, adjusted radiation source so that thyristor 83 may be selectively irradiated preferably while thyristor 84 is masked. The selective irradiation is accomplished by positioning mask or shield plate 105, which is typically the same as shield plate 102, in contact with metal electrodes 99 and 100 to mask thyristor 84 during irradiation of thyristor 83. Also shield plate 105 preferably extends about the periphery of thyristor 83 (not shown) so that cathode-base region 86, anode-base region 86A and anode-emitter region 87 are not irradiated along any of the beveled curvilinear side surfaces of semiconductor body 80. The radiation source is typically the same as that utilized to irradiate thyristor 84, with the energy and dosage levels determined by reference to the irradiation of thyristor 84.

The triacs of the given type of triac, which previously had thyristor 84 irradiated as above described, are thereafter radiated by radiation 106 from the selected, adjusted radiation source to a dosage level sufficient to reduce the switching time of thyristor 83 of the triac to a desired value. The maximum defect generation is preferably provided generally at dotted line 107 in FIG. 6, which is in cathode-base region 86 spaced from blocking PN junction 89 beyond a depletion region formed at PN junction 89 on application of a specified blocking voltage across thyristor 83. As explained in detail hereinafter, such positioning of the maximum defect generation provides for greater reduction of the switching time of thyristor 83 while minimizing increase of forward voltage drop and leakage current.

Figure 7:
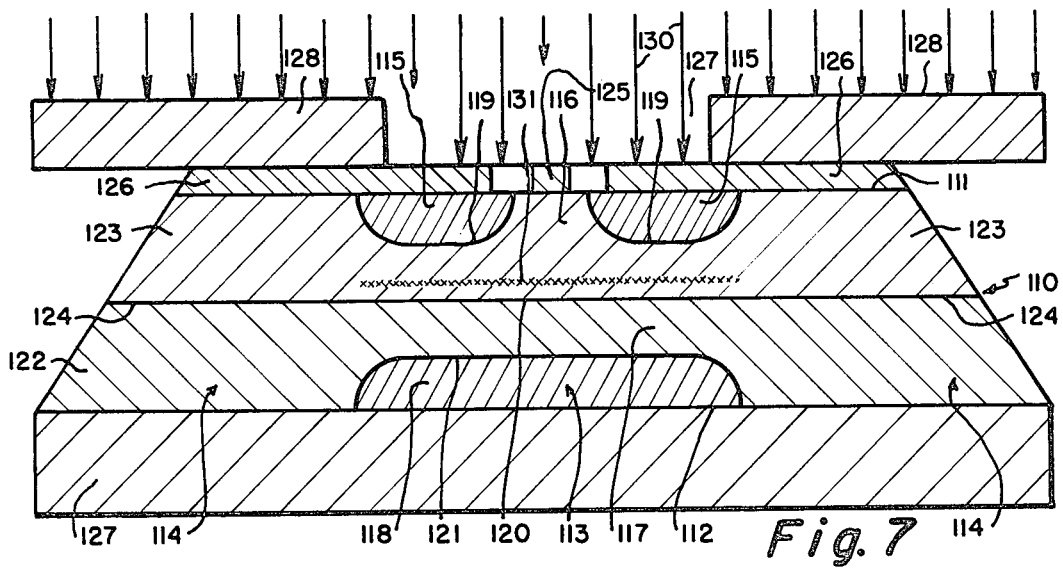
FIG. 7 is an elevational view in cross-section of a reverse conducting thyristor being irradiated in accordance with the present invention.

Referring to FIG. 7, a reverse conducting thyristor being irradiating in accordance with the present invention is disposed in semiconductor body 110 having opposed major surfaces 111 and 112. The reverse conducting thyristor is comprised of center-fired thyristor 113 positioned centrally through semiconductor body 110 between major surfaces 111 and 112, and diode 114 positioned peripherally about thyristor 113 through semiconductor body 110 between major surfaces 111 and 112. The cathode and anode regions of diode 114 are common with the anode-base and cathode-base regions, respectively, of thyristor 113 as described below.

Thyristor 113 is comprised of cathode-emitter region 115 of typically N-type impurity adjoining major surface 111 and anode-emitter region 118 correspondingly of P-type impurity adjoining major surface 112. Positioned between cathode-emitter region 115 and anode-emitter region 118 is cathode-base region 116 of P-type impurity and anode-base region 117 of N-type impurity. Cathode-base and anode-emitter regions 115 and 118 are thereafter simultaneously formed by diffusion of for example gallium and/or aluminum, through major surfaces 111 and 112, typically to a surface concentration between $1 \times 10^{17}$ and $1 \times 10^{19}$ atoms/cm$^3$. Cathode-emitter region 115 is thereafter formed by selective diffusion of for example phosphorus through major surfaces 111 typically to a surface concentration between $1 \times 10^{20}$ and $5 \times 10^{20}$ atoms/cm$^3$. Anode-base region 117 is formed by an impurity typically between $1 \times 10^{13}$ and $1 \times 10^{14}$ atoms/cm$^3$ formed in semiconductor body 110 during its fabrication. By this arrangement, thyristor 113 is provided with a four-layer impurity structure in which three PN junctions 119, 120 and 121 are formed, with PN junction 120 as a blocking junction.

Thyristor 113 is provided with a center-fired gate by adjoining cathode-base region 116 to major surface 111 at center portions of body 110. Cathode-base region 116 also preferably adjoins major surface 111 intermittently of cathode-emitter region 115 (not shown) to form shunts conventional in power thyristors. To provide electrical contact to thyristor 113, gate and cathode electrodes 126 and 127 make ohmic contact to cathode-base region 116 and cathode-emitter region 115, respectively, at major surface 111. Preferably, electrodes 125 and 126 are formed by selective metallization of a suitable metal such as aluminum to typically about 40,000 Angstroms in thickness, or alternatively, by indiscriminate metallization of such a metal followed by selective removal of the deposited metal by standard photolithographic and etch techniques. Metal electrode 127 is typically a support electrode of a suitable metal such as molybdenum to a thickness typically of 80 mils, and makes ohmic contact to anode-emitter region 118 at major surface 112 preferably by alloying the electrode to the semiconductor body 110.

Diode 114 is comprised of cathode region 122 and anode region 125 adjoining major surfaces 112 and 111 respectively. Cathode region 122 and anode region 123 are common with cathode-base region 116 and anode-base region 117, respectively, of thyristor 113 and are typically formed as above described with cathode-base region 116 and anode-base region 117. Formed between cathode region 122 and anode region 123 is blocking PN junction 124, which is an extension of blocking PN junction 120. Electrical contact is made to diode 114 by extending metal electrodes 125 and 127 to make ohmic contact with major surface 111 and 112, respectively, adjoining anode region 123 and cathode region 122.

The reverse switching rectifier is irradiated by positioning major surface 111 of body 110 for exposure to a suitable nuclear radiation source such as a Van de Graaff accelerator. By so positioning body 110, it should be noted that the body is positioned to be irradiated through major surface 111 adjoining and closer the higher impurity region, i.e., the cathode-base region 116, adjoining blocking PN junction 120 of thyristor 113 of the reverse switching rectifier. Maximum defect generation is thereby provided adjacent blocking PN junction 120 in cathode-base region 116 while minimizing or eliminating irradiation of anode-base region 117 of lower impurity concentration. Thyristor 113 of the device is thereby provided with greater reduction of the switching time without significantly increasing the forward voltage drop and leakage current.

Although thyristor 113 and diode 114 may be irradiated simultaneously, thyristor 113 is preferably selectively irradiated while diode 114 is masked from irradiation. The selective irradiation is accomplished by positioning mask or shield plate 128 adjacent metal electrode 126 and 127. Shield plate 128 is of a suitable material of such density and thickness to be opaque to the selective radiation source. Shield plate 128 has a circular opening therein through which the radiation passes without substantial attenuation. For proton or alpha radiation, shield plate 128 may be an aluminum of about 4 mils in thickness, or low-carbon steel, tungsten or lead of like thickness. Shield plate 128 is positioned to minimize the irradiation of diode 114 while permitting the largest possible area of thyristor 113 to be irradiated.

A suitable radiation source is selected that irradiates nuclear particles of a molecular weight of at least about one by following the prescription described above with reference to FIG. 3. Again, proton and alpha particle radiation sources are generally most desirable for either selective or indiscriminate radiation of the device because such a radiation is relatively inexpensive and readily available from commercial radiation sources. In addition, protons and alpha particles are essentially electrically and chemically inactive on penetration into the semiconductor body. Again, it should be emphasized however that higher molecular weight particles such as nitrogen ions may be more useful in certain applications where a narrower half-width is desired for the defect generation distribution in the device.

On selection of the radiation source, the radiation level is again adjusted to provide the depth of maximum defect distribution adjacent blocking PN junction 120 of thyristor 113 of the device. The energy level is adjusted by selecting the appropriate energy range from a graph such as that illustrated in FIG. 10, and thereafter irradiating a number of reverse conducting thyristors of a particular type of reverse conducting thyristor to be irradiated with different energy levels within the selected energy range and measuring the electrical characteristics particularly the switching time, forward voltage drop and leakage current. The optimum energy level can thereby be selected by plotting the measured characteristics on a graph such as the one shown in FIG. 13, or by processing the measured data in a digital computer. In these measurements, only the electrical characteristics of thyristor 113 of the reverse conducting thyristor is considered. Where proton and alpha particle radiation sources are used, the radiation dosage is preferably between about $1 \times 10^{10}$ p/cm$^2$ and $5 \times 10^{11}$ p/cm$^2$ or between about $1 \times 10^9$ alpha particles/cm$^2$ and about $5 \times 10^{10}$ alpha particles/cm$^2$.

Reverse conducting thyristors of the given type of reverse conducting thyristors as shown in FIG. 7 are thereafter irradiated by radiation 130 from the selective, adjusted radiation source to a dosage level sufficient to reduce the switching time of thyristor 113 to a desired level. Again, the optimum dosage level is selected experimentally along the optimum energy level by radiating groups of reverse conducting thyristors of the particular type of reverse conducting thyristor to desired dosage levels, and graphically plotting the forward voltage drop, and also preferably the leakage current of thyristor 113, as a function of the switching time thereof. Again, a digital computer may alternatively be used to process the measured data to select the optimum dosage level. Preferably, maximum defect generation is provided at dotted line 131 in FIG. 7, which is in cathode-base region 116 spaced from blocking PN junction 121 beyond a depletion region formed at the PN junction 121 on application of specified blocking voltage across thyristor 113 of the reverse conducting thyristor. Such positioning of the maximum defect generation provides for greater reduction of switching time with a minimum increase of forward voltage drop and leakage current.

Thereafter, diode 114 of the reverse conducting thyristor may be selectively irradiated while thyristor 113 is masked from irradiation (not shown). This selective irradiation is accomplished similar to the selective irradiation of the two thyristors of the triac as explained with reference to FIG. 6. This, of course, requires that the supporting electrode 125 not be alloyed to the semiconductor body 110 until the radiation sequence is completed. Rather, an electrode is metallized over major surface 112 for irradiation to protect the surface against contamination during the radiation sequence. Radiation of diode 114 selectively or in conjunction with thyristor 113 is not, however, essential to provide some of the benefits of the present invention.

Figure 8:
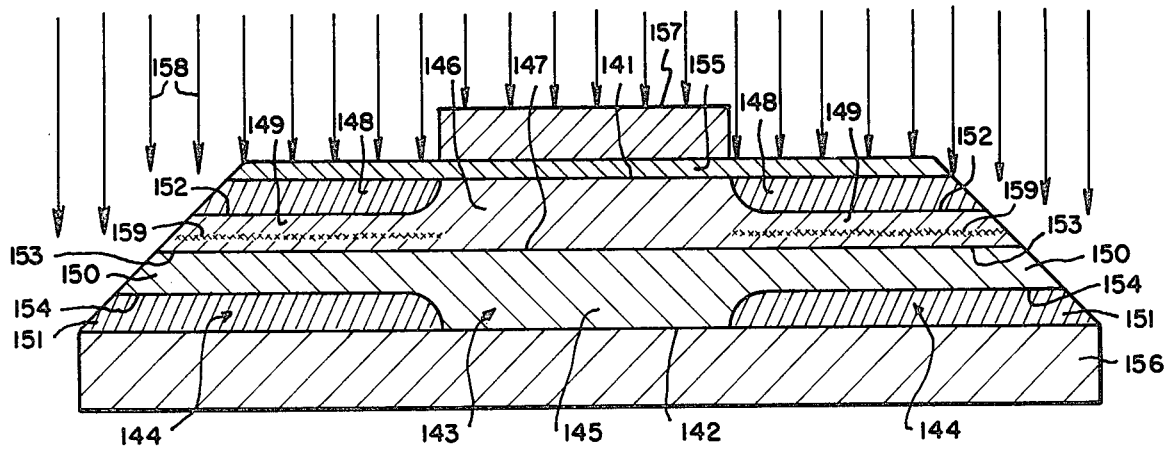
FIG. 8 is an elevational view in cross-section of a reverse switching rectifier being irradiated in accordance with the present invention.

Referring to FIG. 8, a reverse switching rectifier being radiated in accordance with the present invention is disposed in semiconductor body 140 having opposed major surfaces 141 and 142. The reverse switching rectifier is comprised of a diode 143 positioned centrally through semiconductor body 140 between major surfaces 141 and 142, and thyristor 144 positioned peripherally about diode 143 through semiconductor body 140 between major surfaces 141 and 142. The cathode-base and anode-base regions of thyristor 144 are common with the anode and cathode regions, respectively, of diode 143 as described below.

Thyristor 144 is comprised of cathode-emitter region 148 typically N-type impurity adjoining major surface 141 and anode-emitter region 151 correspondingly of P-type impurity adjoining major surface 142. Positioned between cathode-emitter 148 and anode-emitter region 151 is cathode-base region 149 of P-type impurity and anode-base region 150 of N-type impurity. Preferably, cathode-base and anode-emitter regions 149 and 151 are simultaneously formed typically to a surface concentration between about $1 \times 10^{17}$ and $1 \times 10^{19}$ atoms/cm$^3$ by selective diffusion of for example gallium and/or aluminum through major surfaces 141 and 142 by standard techniques. Cathode-emitter region 148 is thereafter formed by diffusion of for example phosphorus through major surface 141 typically to surface concentration between $1 \times 10^{20}$ and $5 \times 10^{20}$ atoms/cm$^3$. Anode-base region 150 is formed by an impurity typically between $1 \times 10^{13}$ and $1 \times 10^{14}$ atoms/cm$^3$ formed in semiconductor body 140 during its fabrication. By this arrangement, thyristor 144 is provided with a four-layer impurity structure in which three PN junctions 152, 153 and 154 are formed, with PN junction 153 a blocking junction.

Diode 143 is comprised of cathode region 145 and anode region 146 adjoining major surfaces 142 and 141 respectively. Cathode region 145 and anode region 146 are common with anode-base region 150 and cathode-base region 149, respectively, of thyristor 144 and are typically formed as above described with anode-base region 150 and cathode-base 149 respectively. Formed between cathode region 145 and anode region 146 is blocking PN junction 147, which is an extension of blocking PN junction 153.

Electrical contact is made to diode 143 and thyristor 144 by metal electrodes 155 and 156. Electrode 155 makes ohmic contact to anode region 146 and cathode-emitter region 148 over major surface 141, and electrode 156 makes ohmic contact to cathode region 145 and anode-emitter region 151 at major surface 142. Preferably, electrodes 155 and 156 are formed by selective metallization of suitable metal such as aluminum of typically about 40,000 Angstroms in thickness, or alternatively, by indiscriminate metallization of such a metal followed by selective removal of deposited metal by standard photolithographic and etch techniques. Where selective irradiation of diode 143 is not performed through major surface 142, electrode 156 may be a supporting electrode of a suitable metal such as molybdenum to a thickness typically of about 80 mils, which is alloyed to major surface 142 by standard procedures.

The reverse switching rectifier is irradiated by positioning major surface 141 of body 140 for exposure to a suitable nuclear radiation source such as a Van de Graaff accelerator. The radiation source is selected as above described with reference to FIGS. 3 and 7. Similarly, the energy level of the radiation source is adjusted, and the dosage level of the irradiation is selected as above described with reference to FIG. 7. Again, where proton and alpha particle radiation sources are used, the radiation dosage is preferably between $1 \times 10^{10}$ and about $5 \times 10^{11}$ p/cm$^2$ or between about $1 \times 10^9$ and about $5 \times 10^{10}$ alpha particles/cm$^2$.

Thyristor 144 is selectively irradiated while masking 143 against irradiation by positioning shield plate 157 in contact with electrode 155 adjacent diode 143. Shield plate 157 is of any suitable thickness and density to be opaque to radiation 158. The maximum defect generation, produced by the adjusted radiation 158, is produced at dotted line 159 adjacent blocking PN junction 153 in cathode-base region 149. Again, the radiation source is adjusted so that the maximum defect generation is spaced from the blocking PN junction 153 beyond a depletion region formed at PN junction 153 on application of a specified voltage across the thyristor 144.

Thereafter, the diode 143 may be selectively irradiated through major surface 142 while masking thyristor 144 as above described with reference to FIGS. 6 and 7.

Referring to FIGS. 9–18, the merits of the present invention were illustrated by irradiating R60NBP diodes and T62N BB, T62N BH, T62N BC, T72N and T73N thyristors with proton and alpha irradiation as taught. In order to produce the maximum defect generation adjacent the blocking PN junction of the devices, the thicknesses of the active regions of the devices were first accurately determined. These structural profiles are shown for the R60NBP diode on the left-hand side of FIG. 9 and for the T62N thyristor on the lefthand side of FIG. 12. Because the diodes were mounted on a support electrode before irradiation as shown in FIG. 3, it was necessary to irradiate through the lower impurity concentration anode region adjoining the blocking PN junction, which is not preferred.

The proton and alpha particle sources were performed with a High Voltage engineering Model CN positive ion Van de Graaff accelerator, which is nominally a 5.5 MeV accelerator. The accelerator was capable of delivering proton particles with energies ranging up to 6.0 MeV. Doubly ionized helium nucleii accelerated through 5.2 MV provided a 10.4 MeV alpha particle radiation source used in the test.

Figure 9:
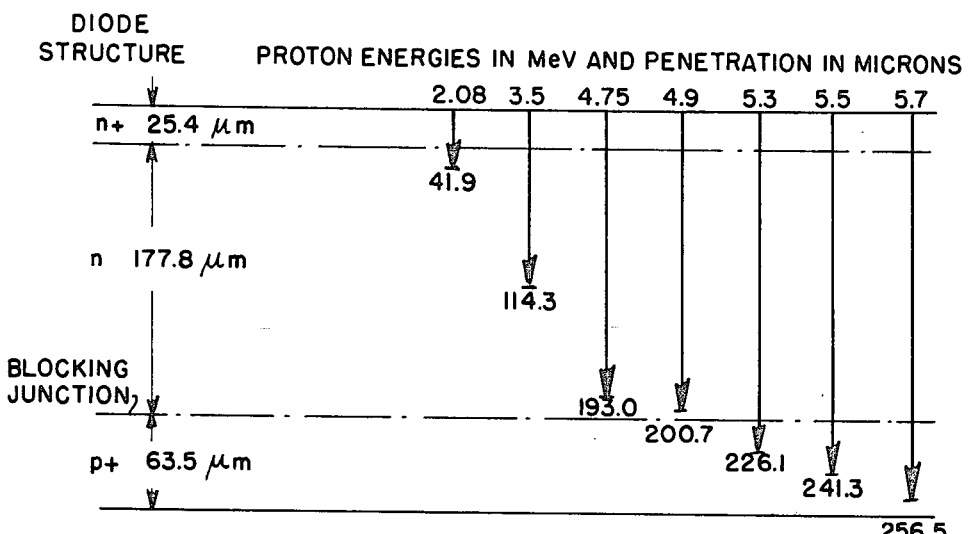
FIG. 9 is a schematic illustrating the depth of penetration of proton irradiation into a diode of a given type that was tested.
Figure 10:
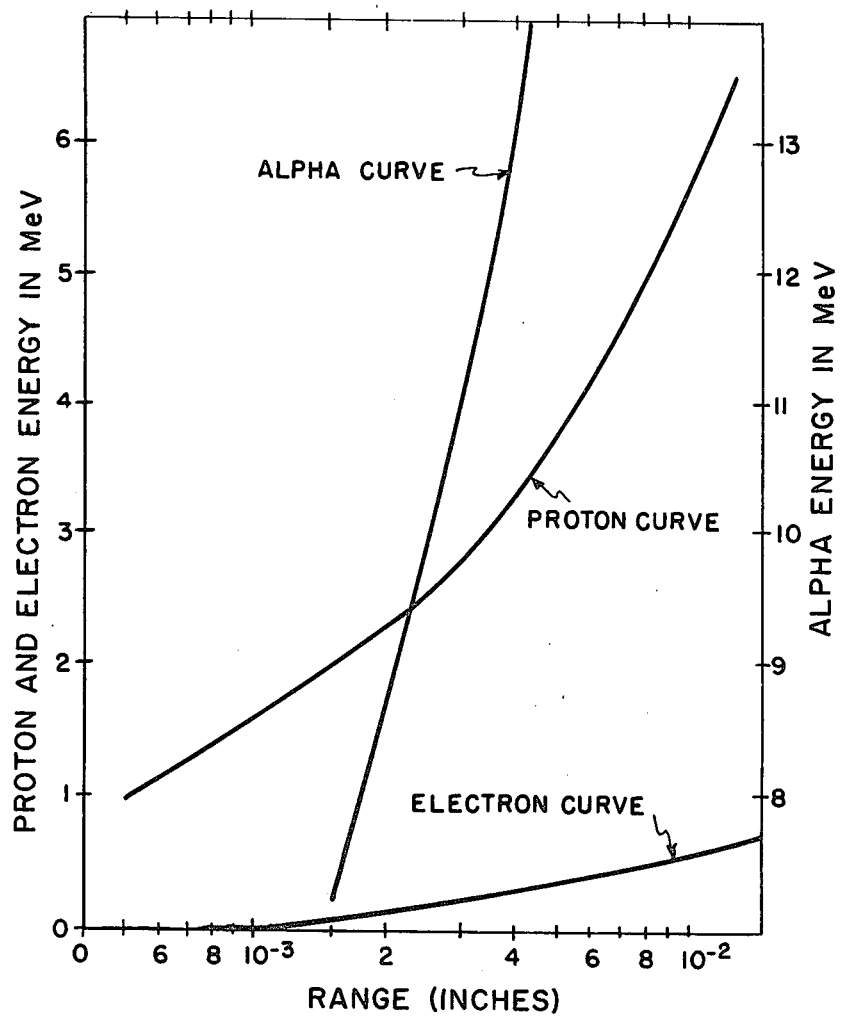
FIG. 10 is a graph showing the relative depth of penetration of proton, alpha and electron radiation as a function of radiation energy.
Figure 11:
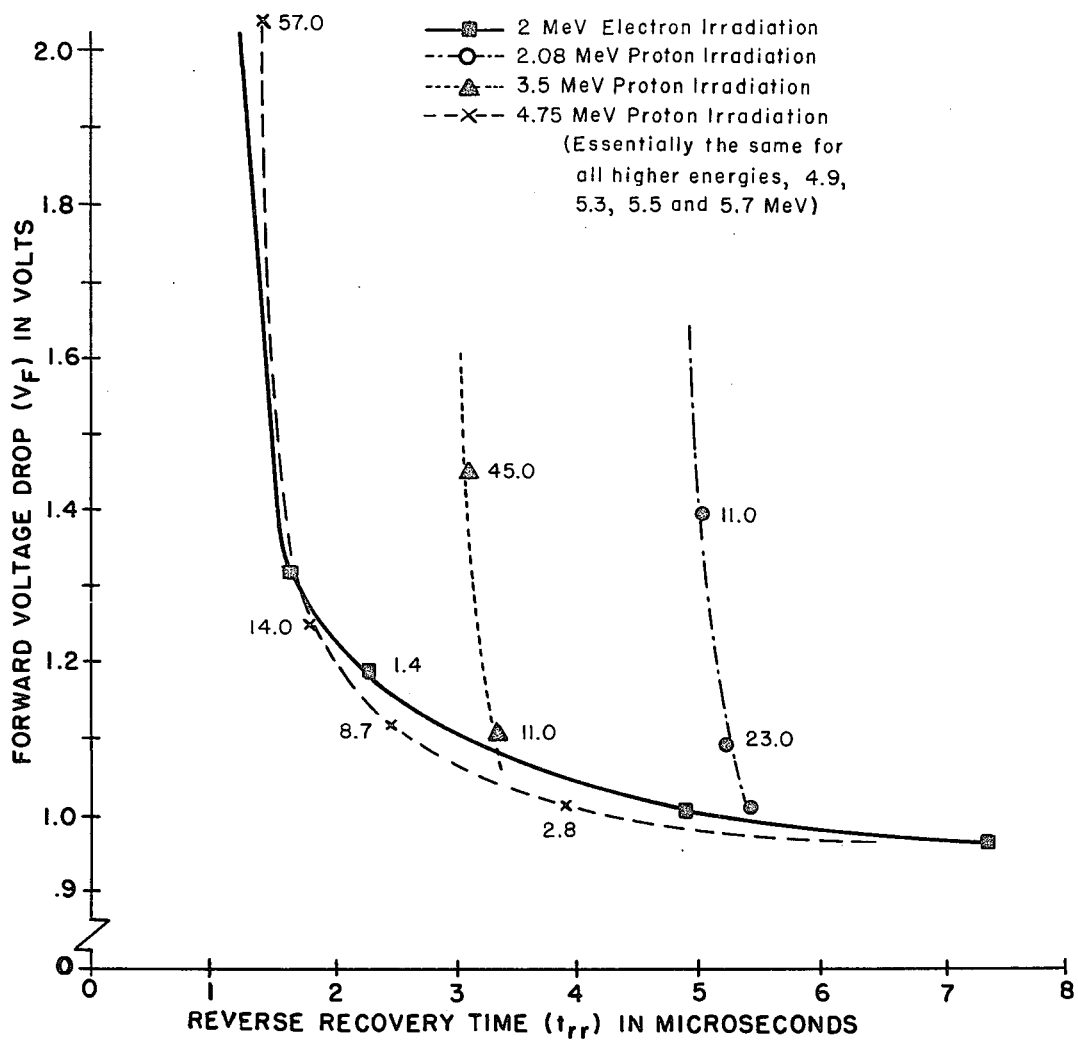
FIG. 11 is a graph showing the relationship between reverse recovery time and forward voltage drop on irradiation of diodes of a given type with different energy proton and electron radiation.
Figure 12:
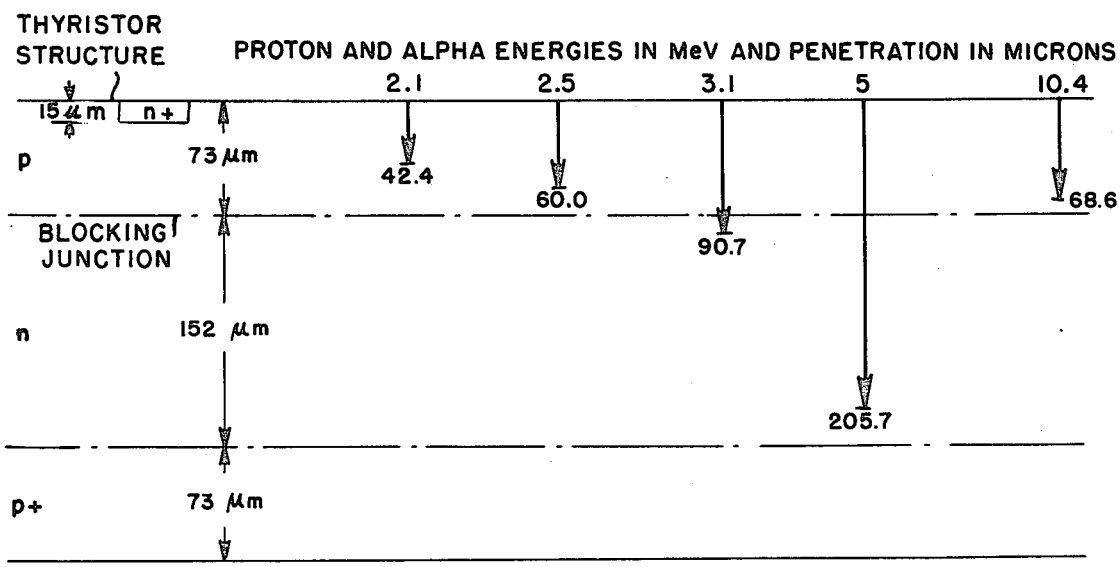
FIG. 12 is a schematic illustrating the depth of penetration of proton and alpha irradiation into thyristor given types that were tested.

The desired energy level for the radiation source was determined by reference to a graph similar to that shown in FIG. 10, where the proton and alpha particle ranges for monoenergetic particles in silicon as shown. Since the maximum defect generation is know to be a gaussian distribution near the end of the particle range, the location of the maximum defect generation could be determined by reference to the structural profile of the device as shown in FIGS. 9 and 12.

For the irradiations, a vacuum-type chamber was constructed having a disc on which typically twenty diodes or thyristors could be mounted. The entire chamber was connected to an evacuated beam line at the accelerator facility. The disc was rotatable so that when an individual device had received its desired dosage of irradiation another device could be positioned for irradiation. A quartz window was positioned in the back of the chamber for precise positioning of the devices for irradiation by the irradiation beam. This quartz window was also utilized for the beam adjustments. The chamber was insulated from the beam line and thus served as a Faraday cup for measurement of the radiation dosage received by each device.

A collimator was inserted into the beam line approximately 12 inches before the devices to be irradiated to limit the area of the beam to that of the area of the device being irradiated. The radiation beam was simultaneously swept horizontally and vertically across the collimator opening, with the vertical frequency of the sweep being approximately 30 times greater than the horizontal sweep frequency. Radiation uniformity was demonstrated by irradiating thin plastic foils with 5 MeV alpha particle irradiation. The particle track distribution observed on etching of the irradiated plastic foils showed that the irradiation was uniform over the area.

On the first test, 100 R60NBP diodes were irradiated with protons of five different energies (20 devices per energy). The five energies were 2.08, 3.5, 4.75, 4.9 and 5.2 MeV. The range of proton penetration of each energy into the diode structure is shown in the right-hand side of FIG. 9. Each group of 20 devices were to be irradiated to two different proton dosages (10 per dose) roughly equivalent to $5 \times 10^{13}$ electrons/cm$^2$ and $2 \times 10^{14}$ electrons/cm$^2$ respecting effects on carrier lifetime in the anode is concerned.

To estimate the desired dosage level for these initial tests, the relationship between the proton damage coefficient and proton energy for 10 ohm-cm N-type float zone silicon (used for manufacture of diodes) was investigated. The principal reference utilized was the W. C. Cooley and R. J. Janda, "Handbook of Space-Radiation Effects on Solar-Cell Power Systems" NASA SP-3003, 1963, p. 26, which provides a graph of the proton damage coefficient as a function of energy in 1 ohm-cm N-type silicon. From this reference, the relationship between the proton damage coefficient and proton energy for 10 ohm-cm N-type silicon was estimated. The proton dosages were then calculated which would be equivalent in their effect on parameters to electron dosages of $5 \times 10^{13}$ and $2 \times 10^{14}$ e/cm$^2$. As a check on the dosage estimates, the lifetimes of the anode regions of the diodes were measured on these initial radiations using reverse-recovery techniques. By observing the change in lifetime produced by the proton irradiation, dosage levels could be adjusted to attain desired reverse recovery time ($t_{rr}$) values.

Irradiation was begun by irradiating one group of ten diodes with 2.08 MeV protons to a dosage of $8 \times 10^{10}$ p/cm$^2$. After the irradiation, lifetime measurements were made which indicated little change in lifetime from the initial measurements before irradiation. Thereafter an additional radiation with 2.08 MeV energy was performed on the same ten diodes to obtain a total accumulated dosage of $1.3 \times 10^{11}$ p/cm$^2$. Also an additional ten diodes were irradiated to a dosage of $4.8 \times 10^{11}$ p/cm$^2$ with 2.08 MeV energy. Again, lifetime measurements indicated only a slight change in carrier lifetimes in the anode regions for both groups, from initial lifetime measurements before any irradiation. Additional irradiations with the 2.08 MeV proton beam were then performed on these groups to achieve total dosage of $1.1 \times 10^{12}$ p/cm$^2$, respectively. The carrier lifetime after these irradiations were approximately the same as those obtained after electron radiation dosages of $5 \times 10^{13}$ e/cm$^2$ and $2 \times 10^{14}$ e/cm$^2$, respectively.

The remaining 80 diodes were irradiated with proton beams of the other four energies above indicated, i.e., 3.5, 4.75, 4.9 and 5.3 MeV, in groups of ten (10) devices to dosages of $1.1 \times 10^{12}$ or $4 \times 10^{12}$ p/cm$^2$. The carrier lifetime measurements again corresponded to $5 \times 10^{13}$ e/cm$^2$ and $2 \times 10^{14}$ e/cm$^2$ in each series.

The forward voltage drop ($V_F$) and reverse recovery time ($t_{rr}$) were then measured on the one hundred diodes. These measurements indicated that the diodes were over-irradiated. Forward voltage drops for all energies and dosages were greater than 20 volts. The reverse recovery time for the diodes irradiated with 2.08 and 3.5 MeV radiation were not satisfactorily reduced. From the groups irradiated to 4.75, 4.9 and 5.3 MeV, reverse recovery time of about 0.5 micro-seconds were obtained for a few of the diodes which did not burn out during measurement.

On subsequent tests, three hundred R60NBP diodes were irradiated in groups of one hundred, with each group subdivided into groups of ten. Each group of ten was irradiated to one of five lowest energies listed in Table I below (expressed in protons per centimeter square) to one of the dosages given in Table I. In addition, four groups of ten R60N BP diodes were then irradiated to one of two highest energies listed in Table I to one of the dosages given in Table I. The estimated dosages (especially at the five highest energies) corresponded to electron radiations of approximately $5 \times 10^{13}$ and $2 \times 10^{14}$ e/cm$^2$. The depth of penetration of particles of the various energies into the diode structure is shown in FIG. 9.

The curves of FIG. 11 indicate that the more desirable forward voltage drop ($V_F$) and reverse recovery time ($t_{rr}$) values are produced with the higher energy protons. Protons of these energies, as shown by FIG. 9, have ranges up to and beyond the blocking PN junction. Thus, narrow regions of heavy displacement damage are produced in the vicinity of and in the higher impurity region adjacent the PN junction. As far as proton irradiation is concerned, this does appear to be a preferred region.

An electron irradiation curve is also shown on FIG. 11. This shows that even in the unpreferred circumstance where the diodes are irradiated with protons through the major surface adjoining or closer the low impurity concentration region adjoining the PN junction (as described above), the electrical characteristics of the diodes were at least as good as those produced with electron irradiations.

On the next tests, T62N thyristors were used having the structural profiles shown on the left-hand sides of FIG. 12. These devices could be readily irradiated through the major surface of the semiconductor body adjoining and closer the higher impurity region adjoining the blocking PN junction. Further, T62N thyristors are of approximately the same size as R60NBP diodes, and therefore, could be readily accommodated in the irradiation chamber for the diode tests. The T62N thyristors had three slice codes BB, BH and BC, with the majority of the irradiation performed with BB type slices.

As shown in FIG. 12, the blocking PN junction in the

TABLE I

| 2.08 MeV | 3.5 MeV | 4.75 MeV | 4.9 MeV | 5.3 MeV | 5.5 MeV | 5.7 MeV |
|---|---|---|---|---|---|---|
| $5.7 \times 10^{10}$ | $1.1 \times 10^{11}$ | $1.4 \times 10^{11}$ | $1.4 \times 10^{11}$ | $1.4 \times 10^{11}$ | $1.4 \times 10^{11}$ | $1.4 \times 10^{11}$ |
| $2.3 \times 10^{11}$ | $4.5 \times 10^{11}$ | $5.7 \times 10^{11}$ | $5.7 \times 10^{11}$ | $5.7 \times 10^{11}$ | $5.7 \times 10^{11}$ | $5.7 \times 10^{11}$ |

The forward voltage drop ($V_F$) and reverse recovery time ($t_{rr}$) of each diode were then measured. The results are shown in FIG. 11 expressed in volts and microseconds. The number by each data point is the dosage, expressed in units of $\times 10^{10}$ protons/cm$^2$, utilized in the irradiations of the diodes from which the data point was derived.

The point of interest of FIG. 11 is the shape of the curves. The shapes of curves are virtually identical, with the bent region shifting toward lower $t_{rr}$ values as the energy of the proton radiation increases. This effect was not anticipated and is not presently understood. It does indicate the reason that the diodes were over-irradiated: Recall that the estimated dosages were based on carrier lifetimes in the anode region which are related to reverse recovery time ($t_{rr}$) values. The lifetimes measured for the 2.08 MeV irradiations showed only a small change in reverse recovery time ($t_{rr}$), after which this parameter changed slowly while the change in $V_F$ was quite rapid.

Some interesting observations can be drawn on the bent regions in these curves. The lifetimes of the irradiated diodes were measured, and the diffusion length L was calculated using the familiar relationship $L = \sqrt{D\iota}$ where D is the diffusion constant. The calculated diffusion lengths corresponded closely to the distance between the junction and the end of the proton range. Further, the lifetime values corresponded to the same reverse recovery time ($t_{rr}$) values as those obtained in the electron irradiations to the corresponding dosage levels.

T62N thyristors is located $73 \pm 5$ microns from the surface of the semiconductor body. Based on the diode tests and previous reasoning, two proton energies, 2.5 and 3.2 MeV were therefore employed in the initial tests. The gaussian shaped defect distributions produced by protons of these energies would be separated by less than 4 microns.

Figure 14:
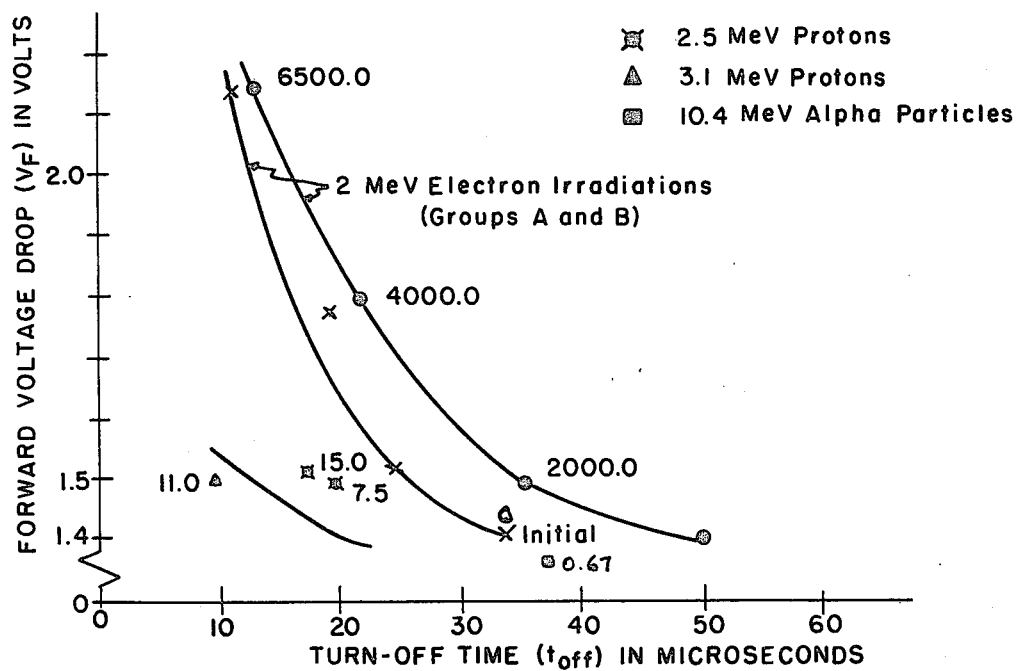
FIG. 14 is a graph showing the relationship between turn-off time and forward voltage drop on irradiation of thyristors of a second given type (T62N BH) with proton, alpha and electron radiation to different dosages.
Figure 15:
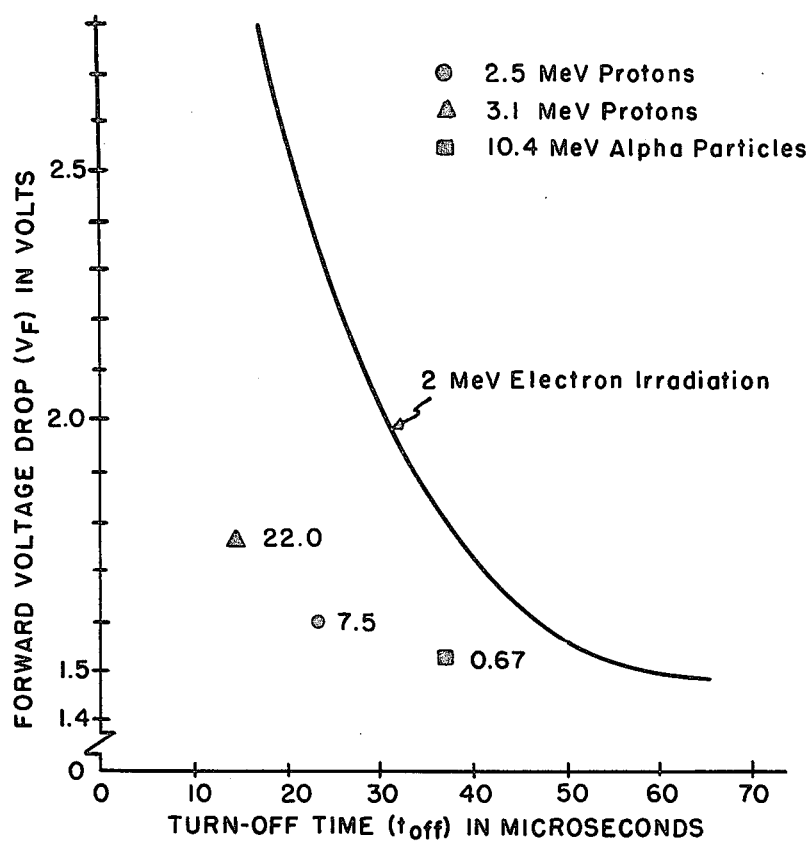
FIG. 15 is a graph showing the relationship between turn-off time and forward voltage drop on irradiation of thyristors of a third given type (T62N BC) with proton, alpha and electron radiation to different dosages.

The results of these tests are shown in FIG. 13 for the T62N BB type of the thyristors, in FIG. 14 for the T62N BH type of thyristors, and in FIG. 15 for the T62N BC type thyristors. Each point on FIGS. 13, 14 and 15 represents the average measured forward voltage drop ($V_F$) and reverse recovery time ($t_{rr}$) values for a group of twenty thyristors irradiated at the selected energy to the selected dosage. The number given by each data point is the radiation dosage used to derive that data point expressed in $\times 10^{10}$ protons/cm$^2$.

The comparison curve shown in FIG. 13 for electron irradiation of T62N BB type thyristors were performed on a previous model, which provides a higher turn-off time than the thyristors used for the irradiations with proton radiation. The difference in model, therefore, indicates a greater improvement in proton irradiation over electron irradiation than a direct comparison between irradiations would show. However, this was the best comparative data available and does indicate an improvement with nuclear irradiation over electron irradiation. The electron curves shown in FIGS. 14 and 15 for T62N BH thyristors provide direct comparisons on identical devices on irradiations with proton and electron radiation.

As shown in FIGS. 13, 14 and 15, both the 2.5 MeV and 3.1 MeV proton irradiation produced forward voltage drops ($V_F$) and turn-off times ($t_{off}$) considerably superior to those produced with the comparable electron irradiations.

Figure 16:
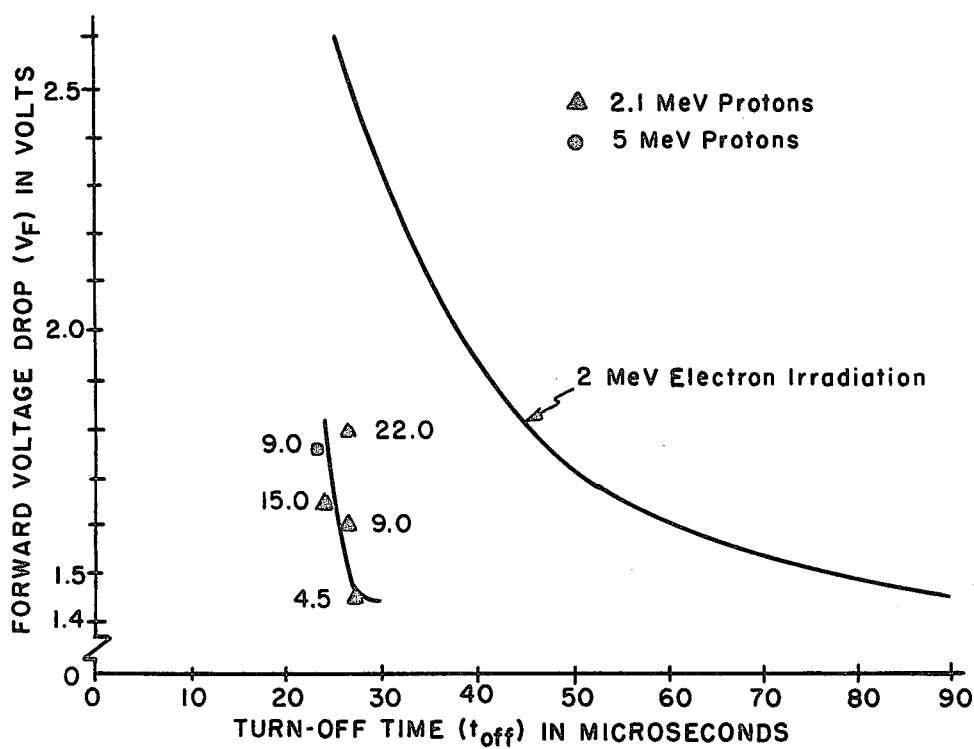
FIG. 16 is a second graph showing the relationship between turn-off and forward voltage drop on irradiation of thyristors of the first given type (T62N BB) with proton, alpha and electron radiation to different dosages.

Proton irradiations at 2.1 MeV and 5 MeV energies are also performed on T62N BB thyristors. The results of these irradiations are shown in FIG. 16. Again, each point on the figure is the average forward voltage drop ($V_F$) in volts and a turn-off time ($t_{off}$) in microseconds of twenty thyristors irradiated to the selected energy to the selected dosage. And the number by each data point is the radiation dosage used to derive that data point expressed in $\times 10^{10}$ protons/cm$^2$. Again, the electron irradiation curve as shown in FIG. 16 is the same as shown in FIG. 13, derived on irradiation of a previous model of T62N BB thyristor.

The results as presented in FIG. 16 are similar to those shown on FIG. 13. The 2.1 MeV irradiations were effective in substantially reducing the turn-off time without increasing the forward voltage drop to a point, at which the forward voltage drop rose sharply with little decrease in turn-off time. Although only one dosage at 5 MeV was tested, it was concluded that a similar behavior for turn-off time and forward voltage drop could be produced at that energy.

Figure 17:
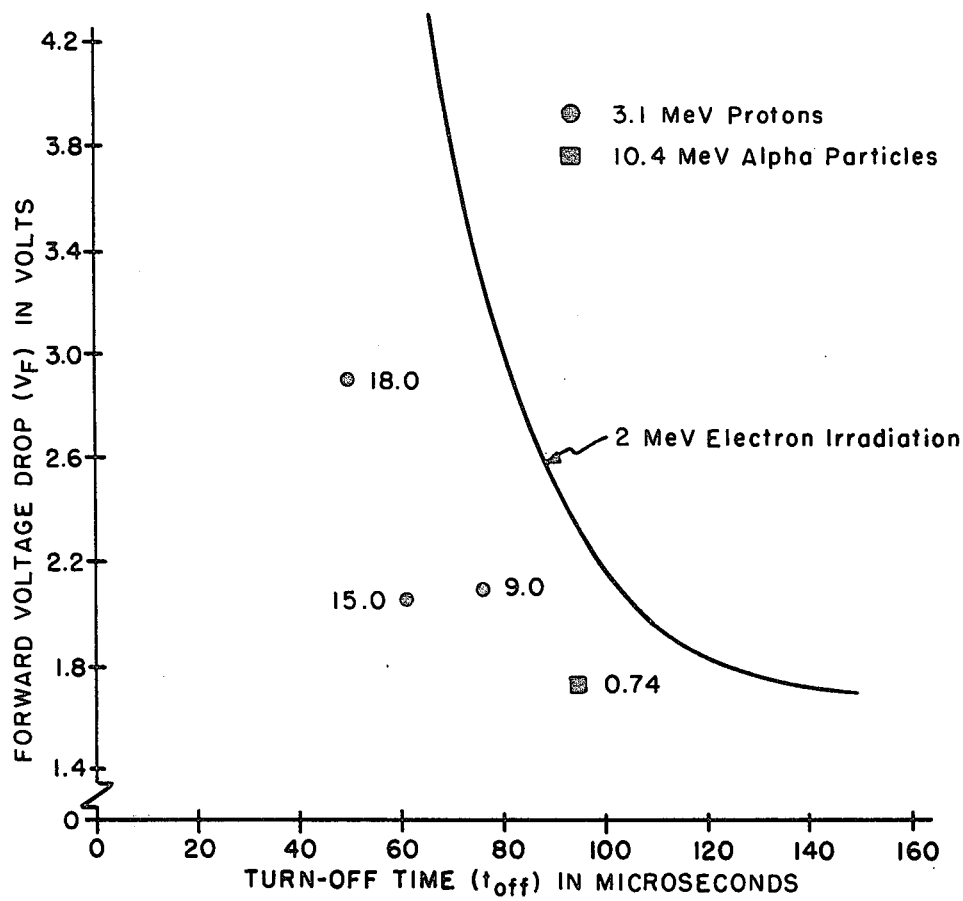
FIG. 17 is a graph showing the relationship between turn-off time and forward voltage drop on irradiation of thyristors of a fourth given type (T72N) with proton, alpha and electron radiation to different dosages.
Figure 18:
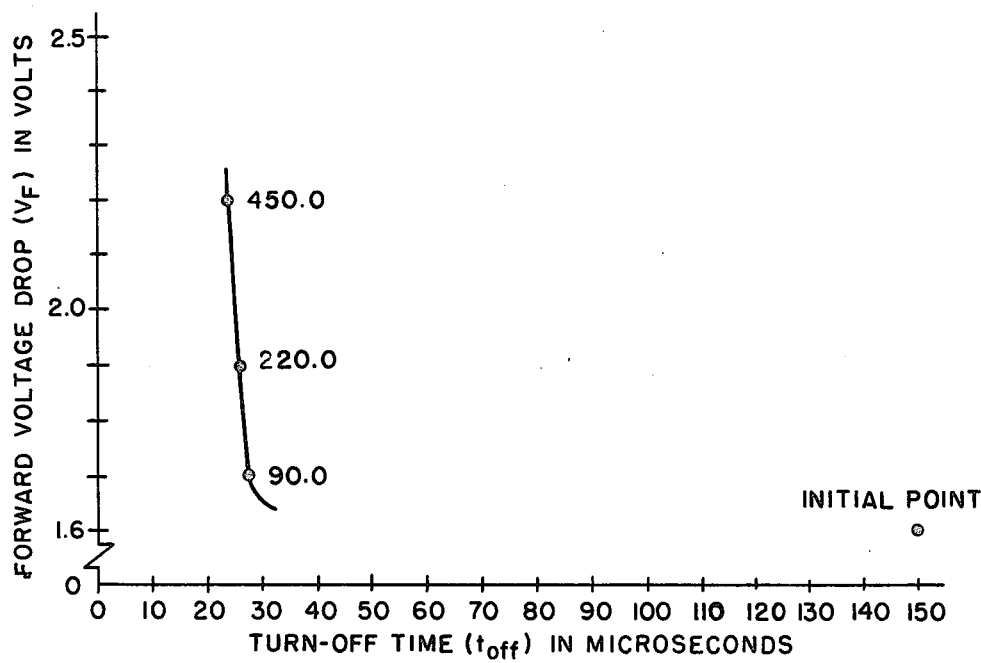
FIG. 18 is a graph showing the relationship between turn-off time and forward voltage drop on irradiation of thyristors of a fifth given type (T73N) with proton, alpha and electron radiation to different dosages.

Similar irradiations were performed on T72N and T73N thyristors with the thin molybdenum covers removed. The results of these tests are shown in FIGS. 17 and 18. Again, each point on the figures is an average of the forward voltage drop ($V_F$) in volts and the turn-off time ($t_{off}$) in microseconds for groups of twenty thyristors irradiated to the selected energy and the selected dosage. And the number by each data point is the radiation dosage used to derive that data point expressed in untis of $10^{10}$ protons/cm$^2$. The structural profiles for the T72N and T73N thyristors are essentially the same as that for T62N BB thyristors as shown on the left-hand side of FIG. 12. The electron curve shown on FIG. 17 is taken from 2 MeV electron irradiations of essentially identical T72N thyristors.

The results shown in FIG. 17 for the T72N thyristor are considered to be somewhat erratic, which was attributed to batch variations. A comparison with the electron irradiation curve, however, confirms that the turn-off time—forward voltage drop characteristics of the thyristor were considerably improved with the proton irradiations.

Figure 19:
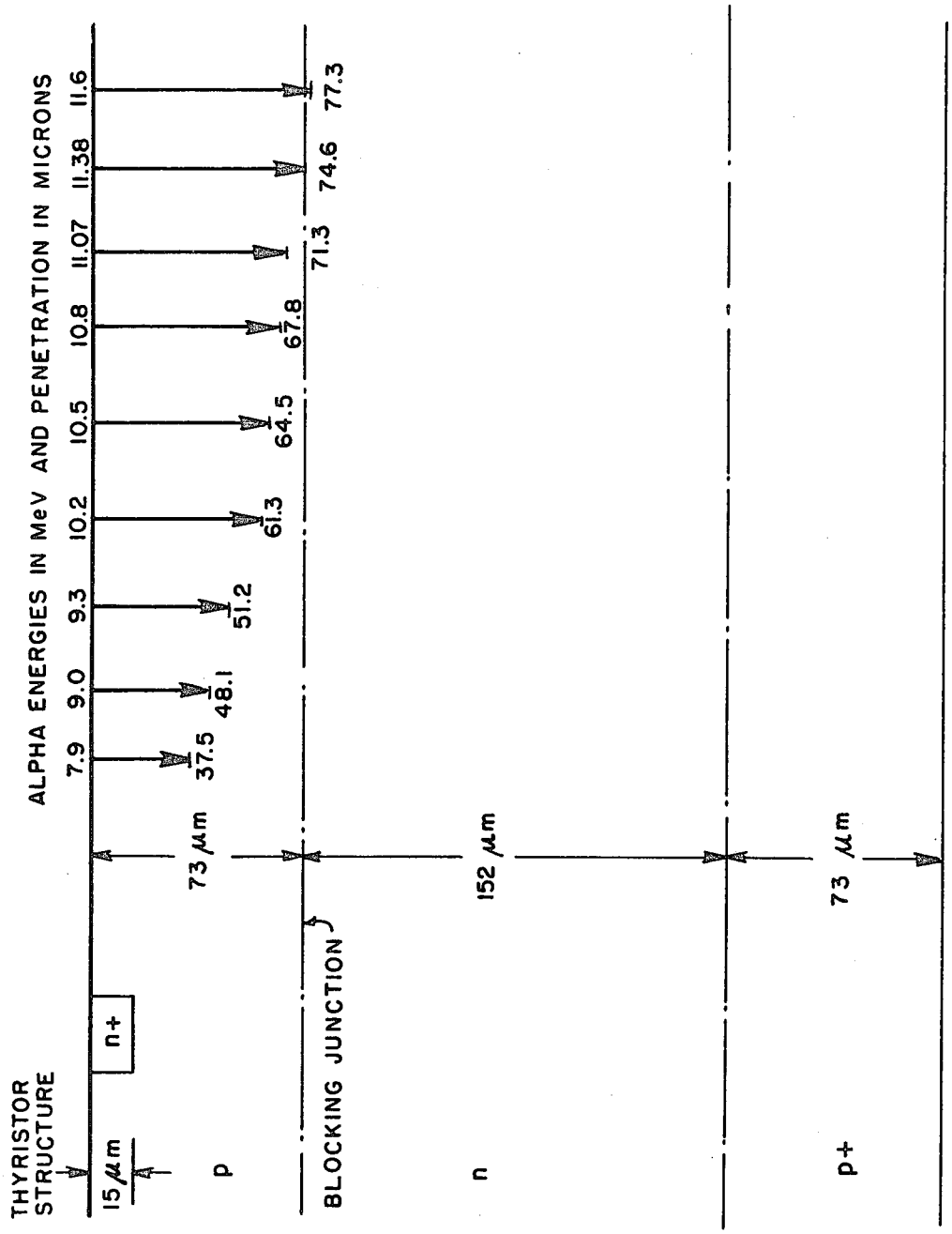
FIG. 19 is a schematic illustrating the depth of penetration of alpha irradiation into thyristors of given types that were tested.

There was not available comparable electron irradiation data for the T73N thyristors. Communications with persons who had done preliminary electron irradiations with T73N thyristors indicated that some preliminary electron irradiations with these thyristors were done but were not considered encouraging. The proton irradiations as shown in FIG. 19 provided thyristors with good forward voltage drop—turn-off time characteristics.

T73N thyristors were also measured for leakage current. The leakage of the thyristors irradiated to the 9 $\times$ 10$^{10}$ p/cm$^2$ dosage was at the border line of acceptable values. A leakage current measured for the other proton dosages was in excess of acceptable values. Accordingly, it was concluded that a slightly lower dosage than 9 $\times$ 10$^{10}$ p/cm$^2$ was the most desired or optimum value.

At the same time that the various types of thyristors were irradiated with proton radiation, initial alpha particle irradiations were also performed. As previously mentioned, by accelerating doubly ionized alpha particles through 5.2 MV, an alpha particle beam of 10.4 MeV was produced. Knowing the structural profiles of the various types of thyristors, it was determined by reference to the graph such as that shown in FIG. 10 the alpha particle penetration into the thyristors were with 10.4 MeV. The exact penetration can be seen by reference to the right-hand side of FIG. 12. The penetration of the 10.4 MeV alpha particle irradiation corresponds to the penetration of 2.5 MeV proton irradiation.

The dosage in the range of interest were estimated at 2.2 $\times$ 10$^{10}$ alphas per centimeter square and 6.7 $\times$ 10$^{10}$ per centimeter square by reference to R. R. Brown and W. E. Horne, "Space Radiation Equivalence for Effects on Transistors" NASA CR-814, July 1967, p. 154 and Yu V. Bulgakov and M. A. Kumakhov, Soviet Physics - Semiconductors, 2, No. 11, 1334 (1968).

The alpha irradiations with 10.4 MeV alpha particles are shown in FIGS. 13, 14, 15 and 17. Each point on the Figures is an average value for forward voltage drop ($V_F$) in volts and turn-off time ($t_{off}$) in microseconds for twenty thyristors irradiated to the selected energy and selected dosage. Consistent with the proton radiations, FIG. 14 shows the alpha irradiations of T62N BB thyristors, FIG. 15 shows the alpha irradiations of T62N BH thyristors, FIG. 17 shows the alpha irradiations of T72N BC thyristors and FIG. 18 shows the alpha irradiations of T72N thyristors. Again the number by each data point is the radiation dosage used to derive that data point expressed in units of 10$^{10}$ alpha particles/cm$^2$.

It is observed from these results that the dosages utilized were too low. The results do, however, indicate virtually no change in forward voltage drop while the turn-off time was substantially reduced. From this data, it was concluded that the alpha irradiation would be at least as good as the proton irradiation in improving the forward voltage drop—turn-off time characteristics of the thyristors. Further, it was anticipated that the alpha irradiations would be better than the proton irradiation: the alpha particle penetration is more precisely defined so that the position of the maximum defect generation can be more precisely located, and in addition, the half-width of the defect generation distribution for alpha particles is narrower so that the defect generation is more localized to reduce leakage current.

Referring to FIGS. 19–23, the next series of tests were conducted with alpha particle irradiation solely. In this series of tests, a Van de Graaff accelerator of the tandem type capable of producing single-ionized alpha particles with radiations up to 19 MeV was used. The vacuum target chamber utilized with this accelerator was essentially the same as the one above described with reference to the former tests. In these tests, a scattering foil of aluminum of 0.45 mils in thickness was utilized to provide uniform distribution of the radiation over the area of the device, rather than the beam modulation previously utilized to provide uniformity. The use of the scattering foil involved sacrifice to a slight degree of the monoenergetics of the radiation beam.

In the first test of this series, one hundred T62N BB thyristors were divided into ten groups of ten. Each group was irradiated with 10.4 MeV alpha irradiation to one of ten dosages shown on FIG. 20. The groups were arranged such that the average electrical characteristic values and the distribution were approximately the same in each group.

10.4 MeV energy was selected from a graph such as that shown in FIG. 10 to correspond to a range of 68.6 microns in silicon. As shown in FIG. 12, the blocking PN junction in these thyristors was located at 73 ± 5 microns. The maximum defect generation distribution was therefore calculated to be produced adjacent the blocking PN junction in the lower impurity concentration N-region as shown on the right-hand side of FIG. 12.

Figure 20:
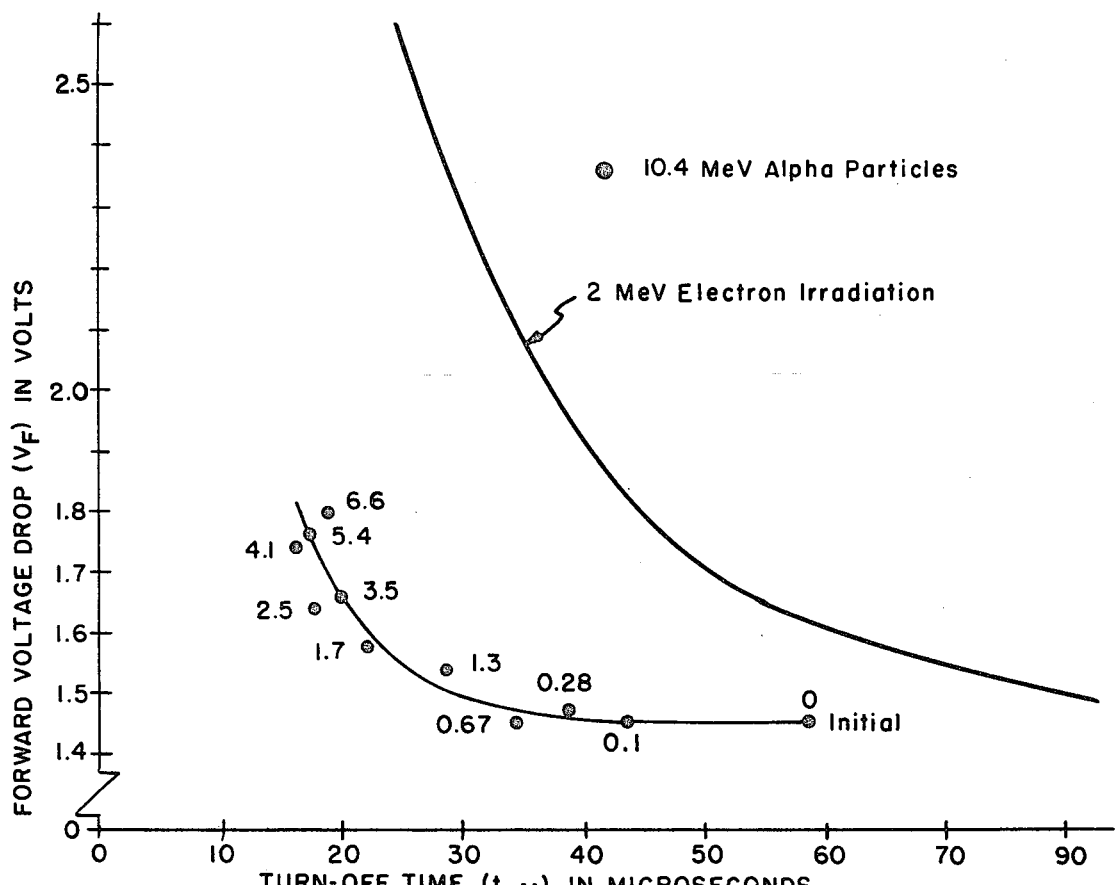
FIG. 20 is a graph showing the relationship between turn-off time and forward voltage drop on irradiation of thyristors of the first given type (T62N BB) with alpha and electron radiation to different dosages.

The results of this test are shown in FIG. 20. The irradiation dosages given for each data point is expressed in units of $10^{10}$ alphas per centimeter square. As shown by FIG. 20, the forward voltage drop ($V_F$) is constant to a dosage of about $6.7 \times 10^9$ alphas per centimeter square, while the turn-off time ($t_{off}$) is reduced from 60 to about 35 microseconds. On irradiation to dosages greater than $6.7 \times 10^9$ alphas per centimeter square, the switching time is further reduced but the forward voltage drop increases rapidly. As shown from the comparative 2 MeV electron irradiation curve also shown in FIG. 20 (the same curve as shown on FIG. 13 derived by irradiation of a previous model T62N BB thyristor) the nuclear irradiation provided a significant improvement in forward voltage drop—switching time characteristics over improvements achieved with comparable electron irradiation. These electrical characteristics are also virtually identical with those obtained with proton irradiations.

In the next test, T62N BH thyristors were irradiated in ten devices per group with alpha particle radiation with energies of 10.5, 10.8, 11.07, 11.38 and 11.6 MeV, respectively. The penetration depths of the radiation into the semiconductor bodies are shown in FIG. 19. It should be pointed out that the total range included the .45 mil scattering foil discussed in connection to the preceding test. The average $V_F$ vs. $t_{off}$ curves for these irradiations is shown in FIG. 21.

Figure 21:
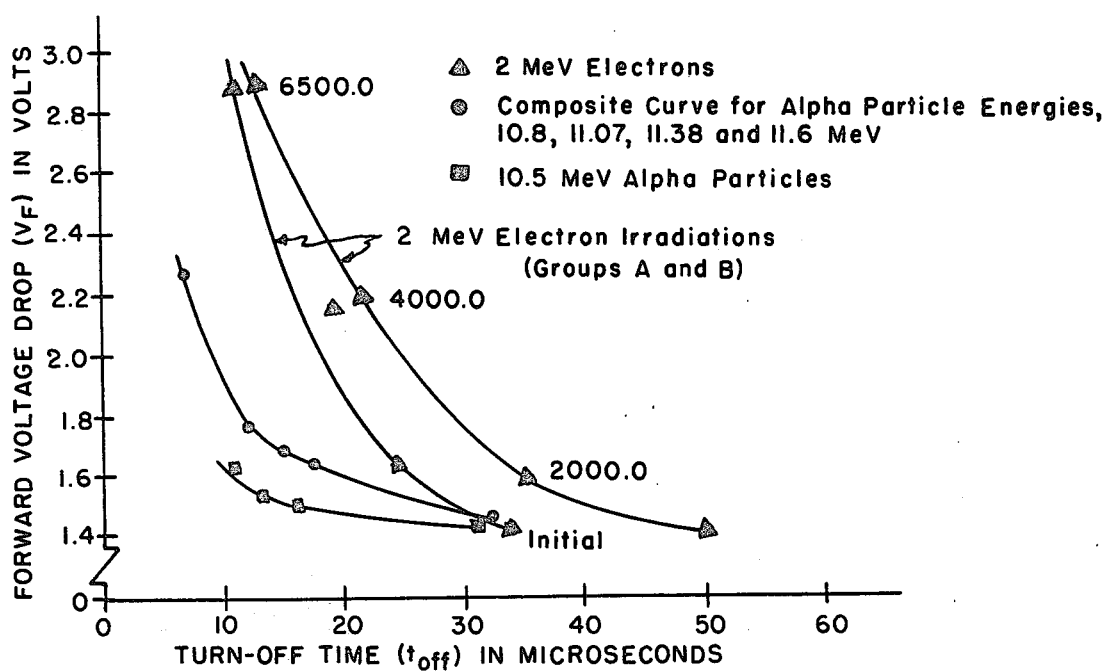
FIG. 21 is a graph showing the relationship between turn-off and forward voltage drop on irradiation of thyristors of the second given type (T62N BH) with alpha and electron radiation to different dosages.

As shown in FIG. 21, the curves for the four highest energies tended to group together. All were significantly better than the 2 MeV electron irradiations shown for direct comparison. Particularly noted was one result with 10.5 MeV energy. With 10.5 MeV energy, the thyristors exhibited decreasing switching times with essentially no change in forward voltage drop ($V_F$) until a turn-off time ($t_{off}$) of 16.5 microseconds was reached. Thereafter the forward voltage drop increased sharply accompanied by changes in the forward blocking capability. The forward blocking capability exhibited 400–600 V reductions at the highest dosages. Measurement at higher dosages were not made because equipment was not available to accurately measure shorter switching speeds. In fact, some difficulty was experienced in obtaining the last data points shown.

From FIG. 19, it is seen that the 10.5 MeV alpha radiations penetrated about 68.6 microns into the thyristors. Since the blocking PN junction depth is 73 ± 5 microns, the maximum defect generation was definitely in the higher impurity concentration adjoining the blocking junction.

The changes in leakage current produced by the alpha radiations were examined in these tests. It is well known that the addition of recombination centers in the depletion region will result in increases in leakage and, hence, limit the blocking capability of devices. However, because the highly damaged region is narrower, and, for 10.5 MeV alpha radiations, short of the blocking PN junction, an increase in the leakage current was not expected until the blocking voltage across the device was increased to a value where the depletion region closely approached the region of maximum defect generation. Further increases in the depletion width were expected to be accompanied by a radical increase (due to the intense concentration of defects) in the leakage current.

This situation was observed on a leakage tester. As the forward blocking voltage was increased, the leakage current increased at the same rate as for a normal unirradiated device. At a particular voltage, a sharp increase in leakage occurred. The particular voltage varied among the devices since it is dependent upon the blocking junction depth as well as other factors.

These observations prompted further tests where the alpha radiation was adjusted to energies such that the damaged region was created outside the depletion region for a specified blocking voltage. Energies selected for the test were 7.9 MeV and 9.3 MeV. The former would create the maximum defect generation at about 37.5 microns which is approximately the mid-point of the cathode-base region as shown in FIG. 19. The latter would create the maximum defect generation at about 51.2 microns, which is just outside the estimated depletion region, which is expected to extend to 55 microns from the surface of the semiconductor body for 1000 V devices. Again, irradiations were performed on T62N BH thyristors in groups of ten for each energy and dosage.

Figure 22:
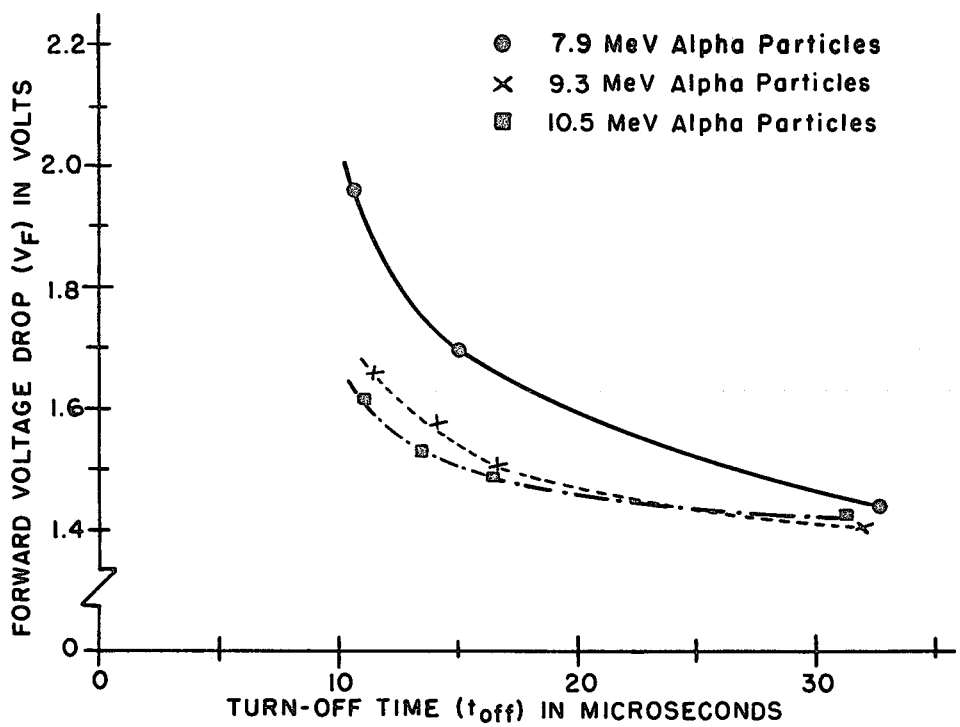
FIG. 22 is a graph showing the relationship between turn-off time and forward voltage drop on irradiation of thyristors of the second given type (T62N BH) with alpha radiation to different dosages.

The resulting $V_F$ vs. $t_{off}$ curves are shown in FIG. 22. The 10.5 MeV alpha radiation curve from FIG. 21 is shown for comparison. No changes (as expected) in leakage where the depletion region closely approached the region of maximum defect generation. Further increases in the depletion width were expected to be accompanied by a radical increase (due to the intense concentration of defects) in the leakage current.

This situation was observed on a leakage tester. As the forward blocking voltage was increased, the leakage current increased at the same rate as for a normal unirradiated device. At a particular voltage, a sharp increase in leakage occurred. The particular voltage varied among the devices since it is dependent upon the blocking junction depth as well as other factors.

These observations prompted further tests where the alpha radiation was adjusted to energies such that the damaged region was created beyond the depletion region for a specified blocking voltage. Energies selected for the test were 7.9 MeV and 9.3 MeV. The former would create the maximum defect generation at about 37.5 microns which is approximately the mid-point of the cathode-base region as shown in FIG. 19. The latter 51.2 microns, which is just beyond the estimated depletion region, which is expected to extend to 55 microns from the surface of the semiconductor body for 1000 V devices. Again, irradiations were performed on T62N BH thyristors in groups of ten for each energy and dosage.

The resulting $V_F$ vs. $t_{off}$ curves are shown in FIG. 22. The 10.5 MeV alpha radiation curve from FIG. 21 is shown for comparison. No changes (as expected) in leakage were observed. The 7.9 MeV energy curve showed a sharp increase in forward voltage drop ($V_F$) as the turn-off time ($t_{off}$) decreased. The 9.3 MeV energy curve approximates the 10.5 MeV energy curve closely with only a moderate increase in forward voltage drop ($V_F$). This suggested that the optimum energy for alpha irradiations was approached at 10.5 MeV.

Figure 23:
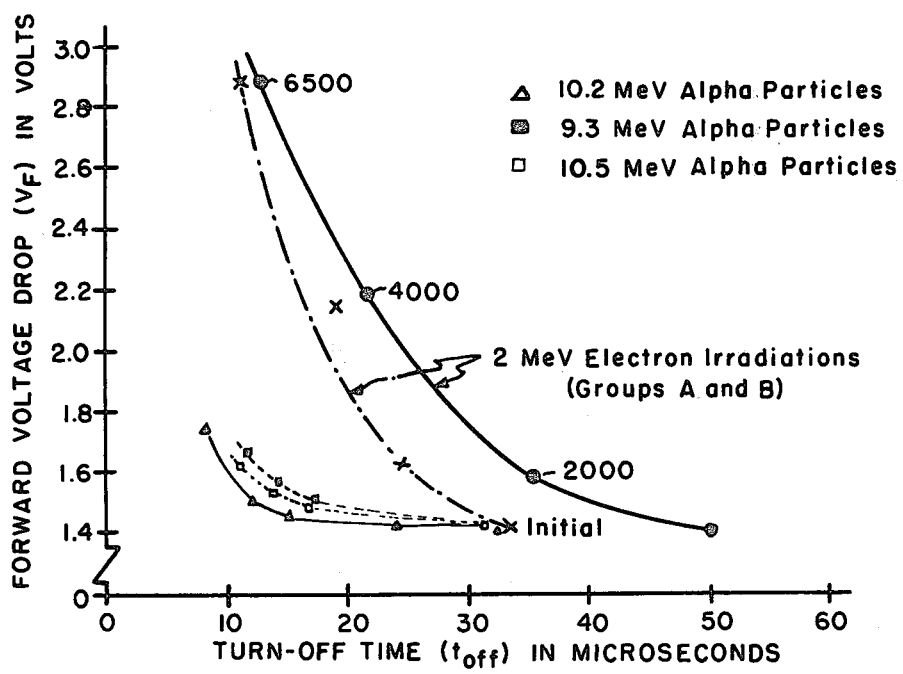
FIG. 23 is a graph showing the relationship between turn-off time and forward voltage drop on irradiation of thyristors of the second given type (T62N BH) with alpha and electron radiation to different dosages.

An intermediate energy of 10.2 MeV was then selected for the next tests. The resulting $V_F - t_{off}$ curve is shown in FIG. 23, with the 9.3 and 10.5 curves from FIG. 22 and 2 MeV electron irradiation curves shown for direct comparison. This Figure shows that the 10.2 MeV energy was a slight improvement over the 9.3 and 10.5 MeV curves. This curve indicates a substantial improvement over electron-irradiation results, as well as other processing techniques such as gold diffusion. It has concluded that the optimum energies for alpha particle irradiations lie between 9.3 and 10.5 MeV. A single optimum energy for all devices may not be usable because of the variations in the blocking PN junction depth and other factors from group to group. The forward blocking voltage of the devices in the 10-14 microsecond switching speed range had been reduced by between 100-200 V on the average.

While presently preferred embodiments have been shown and described with particularity, it is distinctly understood that the invention may be otherwise variously embodied and used within the scope of the following claims.

What is claimed is:

1. A method of reducing the switching time of certain semiconductor devices comprising the steps of:
    A. determining the depth of maximum defect generation in a given type of semiconductor device having a blocking PN junction on irradiation with a given radiation source radiating particles with molecular weight of at least one;
    B. adjusting the energy level of said radiation source to provide the depth of maximum defect generation adjacent a blocking PN junction of said type of semiconductor device;
    C. positioning at least one semiconductor device of said given type with a major surface thereof to be exposed to said adjusted radiation source; and
    D. thereafter irradiating said semiconductor device with said adjusted radiation source to a given dosage level reducing the switching time of said semiconductor device.

2. A method of reducing the switching time of certain semiconductor devices as set forth in claim 1 wherein:
    in step A, said radiation source is selected from the group consisting of proton and alpha particle sources.

3. A method of reducing the switching time of certain semiconductor devices as set forth in claim 1 wherein:
    in step C, the semiconductor device is positioned to irradiate through a major surface thereof closer the higher impurity concentration region adjoining said blocking PN junction.

4. A method of reducing the switching time of ceratin semiconductor devices as set forth in claim 3 wherein:
    in step A, said radiation source is selected from the group consisting of proton and alpha particle sources.

5. A method of reducing the switching time of certain semiconductor devices as set forth in claim 3 wherein:
    in step B, the energy level of said radiation source is adjusted to provide the depth of maximum defect generation in the higher impurity concentration region adjoining said blocking PN junction.

6. A method of reducing the switching time of certain semiconductor devices as set forth in claim 5 wherein:
    in step A, said radiation source is selected from the group consisting of proton and alpha particle sources.

7. A method of reducing the switching time of certain semiconductor devices as set forth in claim 5 wherein:
    in step B, the energy level of said radiation source is adjusted to provide the depth of maximum defect generation in the higher impurity concentration region spaced adjacent a depletion region formed on application of a specified blocking voltage across said PN junction of the semiconductor device.

8. A method of reducing the switching time of certain semiconductor devices as set forth in claim 5 wherein:
    in step A, said radiation source is selected from the group consisting of proton and alpha particle sources.

9. A method of reducing the switching time of gain-operated semiconductor devices comprising the steps of:
    A. determining the depth of maximum defect generation in a given type of gain-operated semiconductor device having a blocking PN junction on irradiation with a given radiation source radiating particles with molecular weight of at least one;
    B. adjusting the energy level of said radiation source to provide the depth of maximum defect generation adjacent a blocking PN junction of said type of semiconductor device;
    C. positioning at least one semiconductor device of said given type with a major surface thereof to be exposed to said adjusted radiation source; and
    D. thereafter irradiating said semiconductor device with said adjusted radiation source to a given dosage level reducing the switching time of said semiconductor device.

10. A method of reducing the switching time of gain-operated semiconductor devices as set forth in claim 9 wherein:
    in step A, said radiation source is selected from the group consisting of proton and alpha particle sources.

11. A method of reducing the switching time of gain-operated semiconductor devices as set forth in claim 9 wherein:
    in step C, the semiconductor device is positioned to irradiate through a major surface thereof closer the higher impurity concentration region adjoining said blocking PN junction.

12. A method of reducing the switching time of gain-operated semiconductor devices as set forth in claim 11 wherein:
    in step A, said radiation source is selected from the group consisting of proton and alpha particle sources.

13. A method of reducing the switching time of gain-operated semiconductor devices as set forth in claim 11 wherein:
    in step B, the energy level of said radiation source is adjusted to provide the depth of maximum defect generation in the higher impurity concentration region adjoining said blocking PN junction.

14. A method of reducing the switching time of gain-operated semiconductor devices as set forth in claim 5 wherein:
    in step A, said radiation source is selected from the group consisting of proton and alpha particle sources.

15. A method of reducing the switching time of gain-operated semiconductor devices as set forth in claim 13 wherein:
    in step B, the energy level of said radiation source is adjusted to provide the depth of maximum defect generation in the high impurity concentration region spaced adjacent a depletion region formed on applications of a specified blocking voltage across said PN junction of the semiconductor device.

16. A method of reducing the switching time of gain-operated semiconductor devices as set forth in claim 15 wherein:
   in step A, said radiation source is selected from the group consisting of proton and alpha particle sources.

17. A method of reducing the turn-off time of thyristors comprising the steps of:
   A. determining the depth of maximum defect generation in a given type of thyristor on radiation with a given radiation source radiating particles with molecular weight of at least one;
   B. adjusting the energy level of said radiation source to provide the depth of maximum defect generation adjacent a blocking PN junction of said type of thyristor;
   C. positioning at least one thyristor of said given type with a major surface thereof to be exposed to said adjusted radiation source; and
   D. thereafter irradiating said thyristor with said adjusted radiation source to a dosage level reducing the turn-off time of said thyristor.

18. A method of reducing the turn-off time of thyristors as set forth in claim 17 wherein:
   in step A, said radiation source is selected from the group consisting of proton and alpha particle sources.

19. A method of reducing the turn-off time of thyristors as set forth in claim 18 wherein:
   in step D, the irradiating is to a dosage level between about $1 \times 10^{10}$ and about $5 \times 10^{11}$ protons per centimeter square or between about $1 \times 10^9$ and about $5 \times 10^{10}$ alphas per centimeter square.

20. A method of reducing the switching time of certain semiconductor devices as set forth in claim 17 wherein:
   in step C, the semiconductor device is positioned to irradiate through a major surface thereof closer the higher concentration region adjoining said blocking PN junction.

21. A method of reducing the turn-off time of thyristors as set forth in claim 20 wherein:
   in step A, said radiation source is selected from the group consisting of proton and alpha particle sources.

22. A method of reducing the turn-off time of thyristors as set forth in claim 21 wherein:
   in step D, the irradiating is to a dosage level between about $1 \times 10^{10}$ and about $5 \times 10^{11}$ protons per centimeter square or between about $1 \times 10^9$ and about $5 \times 10^{10}$ alpha particles per centimeter square.

23. A method of reducing the switching time of certain semiconductor devices as set forth in claim 20 wherein:
   in step B, the energy level of said radiation source is adjusted to provide the depth of maximum defect generation in the higher impurity concentration region adjoining said blocking PN junction.

24. A method of reducing the turn-off time of thyristors as set forth in claim 23 wherein:
   in step A, said radiation source is selected from the group consisting of proton and alpha particle sources.

25. A method of reducing the turn-off time of thyristors as set forth in claim 24 wherein:
   in step D, the irradiating is to a dosage level between about $1 \times 10^{10}$ and about $5 \times 10^{11}$ protons per centimeter square or between about $1 \times 10^9$ and about $5 \times 10^{10}$ alpha particles per centimeter square.

26. A method of reducing the switching time of certain semiconductor devices as set forth in claim 23 wherein:
   in step B, the energy level of said radiation source is adjusted to provide the depth of maximum defect generation in the higher impurity concentration region spaced adjacent a depletion region formed on application of a specified blocking voltage across said PN junction of the semiconductor device.

27. A method of reducing the turn-off time of thyristors as set forth in claim 26 wherein:
   in step A, said radiation source is selected from the group consisting of proton and alpha particle sources.

28. A method of reducing the turn-off time of thyristors as set forth in claim 27 wherein:
   in step D, the irradiating is to a dosage level between about $1 \times 10^{10}$ and about $5 \times 10^{11}$ protons per centimeter square or between about $1 \times 10^9$ and about $5 \times 10^{10}$ alpha particles per centimeter square.

* * * * *